(12) United States Patent
Kanai et al.

(10) Patent No.: US 7,895,894 B2
(45) Date of Patent: Mar. 1, 2011

(54) DRIVER DEVICE, PHYSICAL QUANTITY MEASURING DEVICE, AND ELECTRONIC INSTRUMENT

(75) Inventors: Masahiro Kanai, Suwa (JP); Naoki Yoshida, Suwa (JP); Eitaro Otsuka, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 337 days.

(21) Appl. No.: 11/979,442

(22) Filed: Nov. 2, 2007

(65) Prior Publication Data
US 2008/0105054 A1    May 8, 2008

(30) Foreign Application Priority Data
Nov. 6, 2006   (JP)   ............... 2006-300080
Oct. 30, 2007  (JP)   ............... 2007-282053

(51) Int. Cl.
H03B 5/36   (2006.01)
H03B 5/32   (2006.01)
G01N 27/00  (2006.01)
H03L 5/00   (2006.01)

(52) U.S. Cl. ............... 73/579; 73/866.1; 331/109; 331/154; 331/160

(58) Field of Classification Search ............... 73/579, 73/866.1; 331/109, 154, 160
See application file for complete search history.

(56) References Cited

U.S. PATENT DOCUMENTS

| | | | | |
|---|---|---|---|---|
| 4,758,803 A | * | 7/1988 | Thomas, III | ............... 331/65 |
| 5,054,313 A | * | 10/1991 | Fitzgerald et al. | ........... 73/54.27 |
| 5,185,585 A | * | 2/1993 | Newell et al. | ................. 331/46 |
| 7,089,793 B2 | | 8/2006 | Yokoi et al. | |
| 2008/0087084 A1 | * | 4/2008 | Kanai et al. | ............... 73/514.29 |
| 2008/0178672 A1 | * | 7/2008 | Kanai et al. | ............... 73/504.12 |
| 2009/0015250 A1 | * | 1/2009 | Sunier et al. | ................. 324/244 |
| 2009/0033432 A1 | * | 2/2009 | Kanai et al. | ................. 331/109 |
| 2009/0078045 A1 | * | 3/2009 | Kanai et al. | ................... 73/584 |
| 2009/0084180 A1 | * | 4/2009 | Yoshida et al. | ........... 73/504.02 |

FOREIGN PATENT DOCUMENTS

| | | |
|---|---|---|
| JP | A-2003-240556 | 8/2003 |
| JP | A-2004-286503 | 10/2004 |

* cited by examiner

Primary Examiner—Hezron Williams
Assistant Examiner—Rose M Miller
(74) Attorney, Agent, or Firm—Oliff & Berridge PLC

(57) ABSTRACT

A driver device includes a gain control amplifier that causes a vibrator to produce driving vibrations by controlling an oscillation amplitude in an oscillation loop, a signal generation circuit that generates a signal having a given frequency, and a modulation circuit that modulates the frequency of the signal generated by the signal generation circuit to a resonance frequency of the vibrator. The driver device causes the vibrator to produce the driving vibrations using the signal modulated by the modulation circuit, and then causes the vibrator to produce the driving vibrations by controlling the oscillation amplitude in the oscillation loop formed by the vibrator and the gain control amplifier.

21 Claims, 21 Drawing Sheets

US 7,895,894 B2

DRIVER DEVICE, PHYSICAL QUANTITY MEASURING DEVICE, AND ELECTRONIC INSTRUMENT

Japanese Patent Application No. 2006-300080 filed on Nov. 6, 2006 and Japanese Patent Application No. 2007-282053 filed on Oct. 30, 2007, are hereby incorporated by reference in their entirety.

BACKGROUND OF THE INVENTION

The present invention relates to a driver device which causes a vibrator to produce driving vibrations, a physical quantity measuring device (e.g. vibrating gyroscope) using the driver device, an electronic instrument, and the like.

Gyroscopes are classified as a rotating gyroscope, a vibrating gyroscope, and the like depending on the method of detecting the force applied to an object. In particular, a vibrating gyroscope is considered to be advantageous for reducing size and cost from the viewpoint of the constituent elements and the like. As a vibrating gyrosensor which detects an angular velocity applied to an object, a piezoelectric vibrating gyrosensor is known which excites a crystal or a piezoelectric element that is advantageous for increasing reliability and reducing size. A piezoelectric vibrating gyrosensor utilizes a phenomenon in which a Coriolis force occurs perpendicularly to vibrations when an angular velocity is applied to a vibrating object.

For example, a vibrating gyrosensor which detects an angular velocity causes a physical quantity transducer (vibrator) to produce driving vibrations in a specific direction. When an angular velocity is applied to the vibrator, a Coriolis force occurs perpendicularly to driving vibrations to produce detection vibrations. Since the detection vibrations occur perpendicularly to the driving vibrations, a detection signal (signal component due to detection vibrations) differs in phase from a drive signal (signal component due to driving vibrations) by 90 degrees. The detection signal can be synchronously detected separately from the drive signal utilizing the above phenomenon, for example.

A vibrating gyrosensor is used in a wide variety of applications, such as shake detection for a video camera or a digital camera, positioning using the global positioning system (GPS) for a car navigation system, and aircraft or robot position detection.

A vibrating gyrosensor used in these applications is driven by a battery. Therefore, it is necessary to increase the life of the battery by reducing the power consumption of the vibrating gyrosensor as much as possible. In this case, it is preferable to stop supplying power to the vibrating gyrosensor when an angular velocity or the like is not detected and to supply power to the vibrating gyrosensor from the battery only when using the vibrating gyrosensor. This makes it necessary to cause the vibrating gyrosensor to perform a normal operation within a short period of time after activation.

It is important to reliably cause a vibrating gyrosensor to start an operation which implements steady oscillations by causing current to flow through an oscillation loop during oscillation startup. Specifically, an oscillation driver circuit does not necessarily start the operation which implements steady oscillations even when activating the oscillation driver circuit by supplying power. There may be a case where current does not flow through the oscillation loop even after supplying power, whereby steady oscillations do not occur even after a certain period of time. The reliability of a physical quantity measuring device is increased by preventing such a situation (i.e., oscillation failure).

JP-A-2004-286503 discloses technology which reduces the startup time of a vibrating gyrosensor, for example. JP-A-2004-286503 discloses technology in which a CR oscillation circuit or a ring oscillator is provided in an oscillation loop so that the oscillation amplitude is increased by an amplifier immediately after activation.

A driver device of a vibrating gyrosensor must cause a vibrator to constantly vibrate (oscillate) at its resonance frequency in order to stably detect the angular velocity applied to the vibrator. The driver device also must cause the vibrator to oscillate within a short time to start a normal operation. Moreover, it is preferable to form the driver device using a small circuit with low power consumption in order to increase the life of a battery at low cost.

On the other hand, when forming the vibrator using a crystal with a high Q value and hermetically sealing the vibrator in a package, the driving Q value of the vibrator increases to a large extent. Therefore, the period of time (startup time) until a signal from the vibrator becomes stable increases when causing the vibrator to produce driving vibrations.

According to the technology disclosed in JP-A-2004-286503, when causing the crystal vibrator to oscillate at a frequency close to its driving frequency, the areas of a capacitor and a resistor of the CR oscillation circuit must be increased. This results in an increase in size and cost of a vibrating gyroscope (vibrating gyrosensor). According to the technology disclosed in JP-A-2004-286503, it is difficult to cause the crystal vibrator with a high Q value to operate at its driving frequency because the crystal vibrator is driven at another frequency during startup. Therefore, the period of time until stable oscillations are achieved increases when affected by manufacturing variations and the like.

According to the technology disclosed in JP-A-2004-286503, signal energy from the CR oscillation circuit or the like is injected into the vibrator irrespective of whether or not the vibrator oscillates. In this case, since energy is injected at a specific frequency regardless of the resonance frequency of the vibrator, the signal from the CR oscillation circuit hinders steady oscillations when the vibrator produces steady oscillations. Therefore, in order to reduce the startup time required for the vibrator to produce steady oscillations, it is necessary to inject energy into the oscillation loop so that the oscillations of the vibrator are not hindered due to an oscillation condition which differs to a large extent from the steady oscillation condition of the oscillation loop including the vibrator.

SUMMARY

According to one aspect of the invention, there is provided a driver device that forms an oscillation loop with a vibrator and causes the vibrator to produce driving vibrations, the driver device comprising:

a gain control amplifier that causes the vibrator to produce the driving vibrations by controlling an oscillation amplitude in the oscillation loop;

a signal generation circuit that generates a signal having a given frequency; and a modulation circuit that modulates the frequency of the signal generated by the signal generation circuit to a resonance frequency of the vibrator, the driver device causing the vibrator to produce the driving vibrations using the signal modulated by the modulation circuit, and then causing the vibrator to produce the driving vibrations by controlling the oscillation amplitude in the oscillation loop formed by the vibrator and the gain control amplifier.

According to another aspect of the invention, there is provided a physical quantity measuring device that measures a physical quantity corresponding to a detection signal output from a vibrator based on driving vibrations produced by the vibrator and the physical quantity to be measured, the physical quantity measuring device comprising:

the vibrator;

the driver device as defined in claim 1 that causes the vibrator to produce the driving vibrations; and a detection device that detects an output signal corresponding to the physical quantity based on the detection signal, the detection device including a synchronous detector that synchronously detects the detection signal based on an output from a comparator, the comparator generating a synchronous detection reference signal based on a signal in the oscillation loop.

According to a further aspect of the invention, there is provided an electronic instrument including the above physical quantity measuring device.

According to still another aspect of the invention, there is provided a method of driving a vibrator using an oscillation loop including a driver element, the method comprising:

mixing a noise component that contains a resonance frequency component of the vibrator into a path in an oscillation startup state, the path connecting the vibrator and the driver element and not connected with other circuits;

selecting a frequency component that coincides with the resonance frequency of the vibrator from the noise component utilizing frequency selectivity of the vibrator; and causing oscillations to grow using the selected signal component as a cause of oscillations.

DETAILED DESCRIPTION OF THE EMBODIMENT

Figure 1:
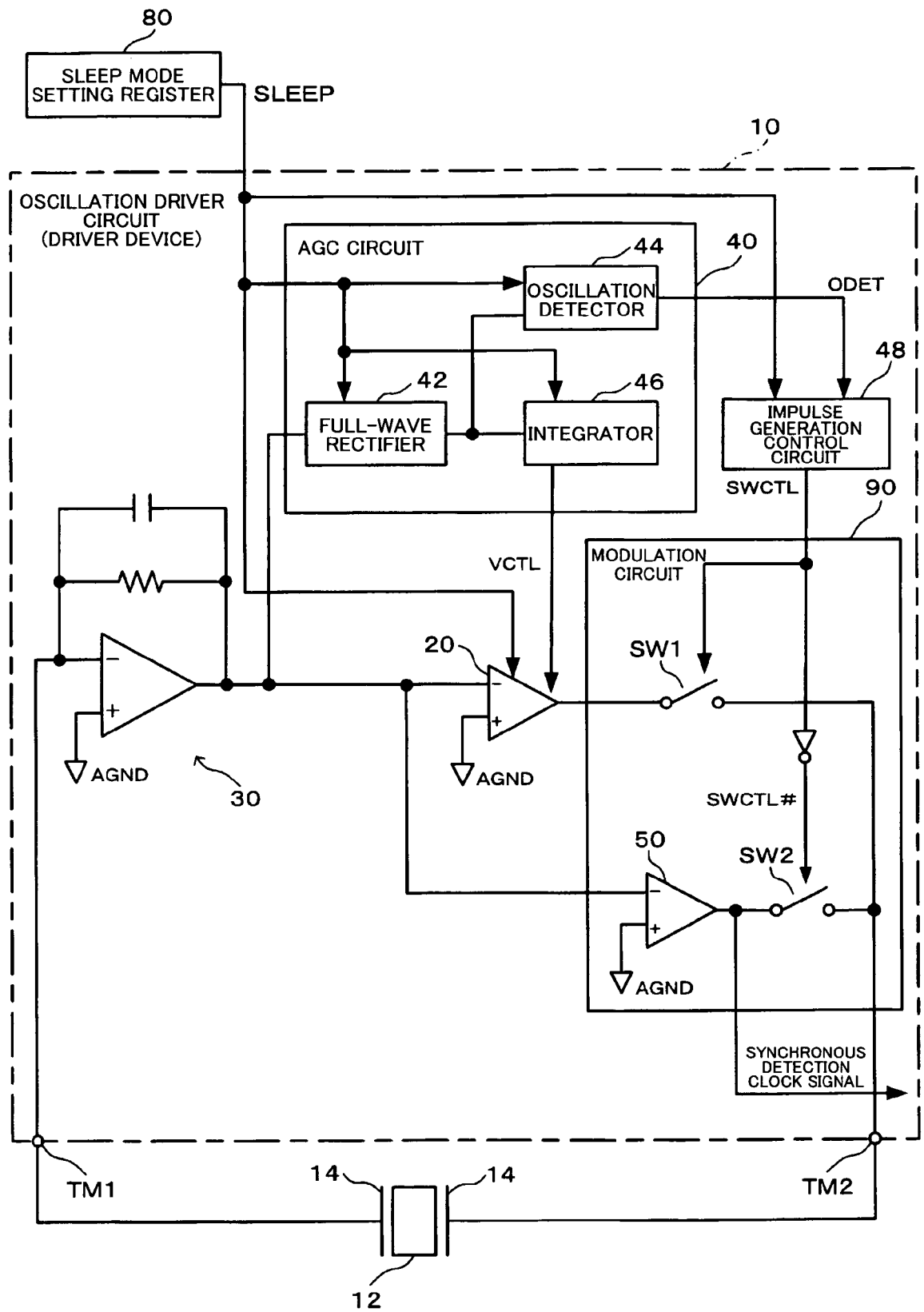
FIG. 1 is a circuit block diagram showing a configuration example of an oscillation driver circuit according to one embodiment of the invention.

Aspects of the invention may provide a driver device which can reduce the oscillation startup time by efficiently performing oscillation startup while minimizing hindrance to oscillations of a vibrator, a physical quantity measuring device and an electronic instrument using the driver device.

(1) According to one embodiment of the invention, there is provided a driver device that forms an oscillation loop with a vibrator and causes the vibrator to produce driving vibrations, the driver device comprising:

a gain control amplifier that causes the vibrator to produce the driving vibrations by controlling an oscillation amplitude in the oscillation loop;

a signal generation circuit that generates a signal having a given frequency; and a modulation circuit that modulates the frequency of the signal generated by the signal generation circuit to a resonance frequency of the vibrator, the driver device causing the vibrator to produce the driving vibrations using the signal modulated by the modulation circuit, and then causing the vibrator to produce the driving vibrations by controlling the oscillation amplitude in the oscillation loop formed by the vibrator and the gain control amplifier.

According to this embodiment, energy is injected into the vibrator during oscillation startup using the modulated signal from the modulation circuit, whereby the oscillation startup time of the vibrator can be reduced. Moreover, since the frequency of the modulated signal from the modulation circuit has been modulated to the resonance frequency of the vibrator, the oscillation condition does not differ to a large extent from the steady oscillation condition of the oscillation loop. Therefore, energy can be injected into the oscillation loop without hindering the oscillations of the vibrator, whereby oscillation startup can be efficiently achieved.

In the oscillation loop, the vibrator generally allows only a resonance frequency component contained in white noise in the oscillation loop to pass through. As a result, only a resonance frequency signal component is amplified, whereby the vibrator starts to oscillate. Specifically, a general oscillation circuit amplifies only a resonance frequency component of the vibrator contained in intrinsic noise (particularly white noise) in the oscillation loop to cause the vibrator to oscillate. However, intrinsic noise changes to a large extent due to changes in temperature conditions, power supply conditions, and process conditions. Therefore, the period of time until a steady oscillation state is achieved after oscillation startup also changes to a large extent due to changes in temperature conditions, power supply conditions, and process conditions. According to this embodiment, the vibrator can be reliably caused to oscillate using the modulation circuit irrespective of changes in temperature conditions, power supply conditions, and process conditions, and the period of time until a steady oscillation state is achieved after oscillation startup can be reliably reduced.

(2) In the driver device, the modulation circuit may include a comparator that generates a synchronous detection reference signal based on a signal in the oscillation loop; and the driver device may cause the vibrator to produce the driving vibrations based on the signal modulated by the modulation circuit while switching between an output from the gain control amplifier and an output from the comparator, and then may cause the vibrator to produce the driving vibrations by controlling the oscillation amplitude in the oscillation loop formed by the vibrator and the gain control amplifier.

According to this embodiment, when measuring a physical quantity using an output signal obtained by synchronously detecting a detection signal output from the vibrator based on driving vibrations produced by the vibrator and the physical quantity to be measured, a comparator that generates a synchronous detection reference signal is provided. The comparator generates the reference signal based on the signal in the oscillation loop, and the driver device causes the vibrator to produce driving vibrations during oscillation startup based on the signal modulated by the modulation circuit while switching between the output from the gain control amplifier and the output from the comparator. This makes it possible to utilize the comparator necessary for synchronous detection as a means that accelerates oscillation startup, whereby synchronous detection and oscillation startup can be accelerated.

(3) In the driver device, when the driver device is set in a first operation mode to perform a normal operation, the driver device may cause the vibrator to produce the driving vibrations using the signal modulated by the modulation circuit, and then may cause the vibrator to produce the driving vibrations by controlling the oscillation amplitude in the oscillation loop formed by the vibrator and the gain control amplifier; and when the driver device is set in a second operation mode to perform a sleep operation, the driver device may cause the vibrator to produce the driving vibrations in the oscillation loop formed by the vibrator and the comparator.

According to this embodiment, the first and second operation modes are provided, and the oscillation loop is switched as described above when the driver device is set in the first operation mode. When the driver device is set in the second operation mode, it is unnecessary to operate the circuit section which controls oscillations in the first operation mode. Therefore, a reduction in power consumption in the second operation mode and a high-speed oscillation startup when the second operation mode has been canceled can be achieved in combination.

(4) In the driver device, the driver device may further include:

a gain control circuit that controls a gain of the gain control amplifier based on an oscillation signal in the oscillation loop, when the driver device is set in the second operation mode, the driver device may disable operations of the gain control amplifier and the gain control circuit without disabling an operation of the comparator.

According to this embodiment, when the driver device is set in the first operation mode, oscillation startup is accelerated during oscillation startup using the modulated signal from the modulation circuit, and the gain control amplifier controls the oscillation amplitude in the oscillation loop when a steady oscillation state has been achieved. This accelerates synchronous detection and oscillation startup. When the driver device is set in the second operation mode, the oscillation state is maintained in the oscillation loop while the operations of the gain control amplifier and the gain control circuit are suspended. Therefore, a reduction in power consumption in the second operation mode and a high-speed oscillation startup when the second operation mode has been canceled can be achieved in combination.

(5) In the driver device, the signal generation circuit may generate the signal having the given frequency only in a specific period that starts based on a switch timing from the second operation mode to the first operation mode.

According to this embodiment, energy is also injected into the vibrator using the modulated signal from the modulation circuit when the second operation mode is switched to the first operation mode, whereby the oscillation startup time of the vibrator can be reduced. In this case, since the frequency of the modulated signal from the modulation circuit has been modulated to the resonance frequency of the vibrator, the oscillation condition does not differ to a large extent from the steady oscillation condition of the oscillation loop. Therefore, energy can be injected into the oscillation loop without hindering the oscillations of the vibrator, whereby oscillation startup can be efficiently achieved.

(6) In the driver device, the polarity of the output from the gain control amplifier with respect to a reference potential may be the same as the polarity of the output from the comparator with respect to the reference potential.

According to this embodiment, it is unnecessary to provide a circuit which reverses polarity, whereby an increase in circuit scale can be suppressed.

(7) In the driver device, the driver device may cause the vibrator to produce the driving vibrations based on the signal modulated by the modulation circuit while switching between an output from the gain control amplifier and a given voltage, and then may cause the vibrator to produce the driving vibrations by controlling the oscillation amplitude in the oscillation loop formed by the vibrator and the gain control amplifier.

According to this embodiment, the driver device causes the vibrator to produce driving vibrations based on the signal modulated by the modulation circuit while switching between the output from the gain control amplifier and a given voltage. This accelerates oscillation startup without utilizing a comparator for synchronous detection.

(8) In the driver device, the signal generation circuit may generate the signal having the given frequency only in a specific period.

(9) In the driver device, a start timing of the specific period may be a power-on reset start timing of the driver device.

(10) In the driver device, a finish timing of the specific period may be a timing when it has been detected that a signal in the oscillation loop has exceeded a specific threshold value level or a timing when a specific number has been counted based on a start timing of the specific period.

According to any of the above embodiments (8) to (10), since the circuit necessary for controlling the oscillation amplitude in the oscillation loop can be utilized or a circuit that detects the level in the oscillation loop can be omitted, an increase in circuit scale can be suppressed. In particular, the convenience to the user can be increased by specifying the start timing (modulation start timing) of the specific period in which the signal necessary for the modulation circuit is generated. Moreover, the length of the specific period can be specified by counting a given reference clock signal based on the start timing, for example. Specifically, the finish timing (modulation finish timing) of the specific period can be easily determined. Therefore, a circuit that detects the oscillation amplitude can be omitted, for example, whereby the circuit scale can be reduced.

(11) In the driver device, the modulation circuit may be provided in the oscillation loop on an output side of the gain control amplifier and electrically connected with one end of the vibrator.

According to this embodiment, the signal modulated by the modulation circuit is supplied to only the vibrator without being supplied to other analog circuits in the oscillation loop. Since the signal from the modulation circuit serves as a noise component for other analog circuits, malfunction of the analog circuits and unnecessary power consumption can be suppressed by employing this embodiment.

(12) In the driver device,
the signal generation circuit may include:
a power-on reset circuit that generates a power-on reset signal; and
a pulse generation circuit that generates one or more pulses in a specific period based on the power-on reset signal;
the pulse generation circuit may include a plurality of delay units, each of the plurality of delay units generating a pulse based on an input signal, the pulse generation circuit outputting a logical OR result of the pulses generated by the plurality of delay units; and
the driver device may output the signal having the given frequency in a period from a change timing of the power-on reset signal to a change timing of a detection result signal that indicates that the signal in the oscillation loop has exceeded a specific threshold value level.

According to this embodiment, the signal necessary for the modulation circuit can be generated using a simple circuit configuration.

(13) According to another embodiment of the invention, there is provided a physical quantity measuring device that measures a physical quantity corresponding to a detection signal output from a vibrator based on driving vibrations produced by the vibrator and the physical quantity to be measured, the physical quantity measuring device comprising:
the vibrator;
the driver device as defined in claim 1 that causes the vibrator to produce the driving vibrations; and
a detection device that detects an output signal corresponding to the physical quantity based on the detection signal,
the detection device including a synchronous detector that synchronously detects the detection signal based on an output from a comparator, the comparator generating a synchronous detection reference signal based on a signal in the oscillation loop.

According to this embodiment, a physical quantity measuring device can be provided which prevents breakage of a vibrator without increasing the circuit scale and reduces size and power consumption by applying a driver device which can reduce the oscillation startup time by efficiently performing oscillation startup while minimizing hindrance to oscillations of the vibrator.

(14) In the physical quantity measuring device, the detection device may include a phase shifter that adjusts phases of the output from the comparator and the detection signal.

According to this embodiment, since the phase can be adjusted depending on a change in phase during a weak signal detection process, a highly accurate phase adjustment can be achieved while preventing an increase in circuit scale.

(15) According to a further embodiment of the invention, there is provided an electronic instrument including one of the physical quantity measuring devices.

This embodiment contributes to reducing the size and the power consumption of an electronic instrument which performs a given process using the physical quantity measurement results. According to this embodiment, an electronic instrument can be provided which includes a driver device which can prevent breakage of a vibrator and reduce the oscillation startup time without increasing the circuit scale.

(16) In the driver device,
the vibrator may be a capacitive-coupling vibrator; and
the gain control amplifier may cause the vibrator to produce the driving vibrations by applying a rectangular-wave drive signal to the vibrator.

The rectangular-wave drive method has an advantage in that the variation in the driving signal is small. Moreover, since the voltage amplitude is easily controlled, the circuit configuration can be simplified, whereby the circuit scale can be reduced. When using the capacitive-coupling vibrator (vibrator in which a direct-current blocking capacitor lies in the signal path in the internal equivalent circuit), an arbitrary potential may be used as the direct-current potential of the oscillation loop, whereby the degree of freedom relating to the circuit configuration is increased. A piezoelectric element can be given as an example of the capacitive-coupling vibrator (capacitive vibrator).

(17) In the driver device,
the signal generation circuit may generate the signal that has a first frequency higher than the resonance frequency of the vibrator; and
the modulation circuit may AM-modulate a mixed signal that is mixed into the oscillation loop based on the signal that has the first frequency using an output signal from the gain control amplifier, the mixed signal having the first frequency and functioning as a carrier, and the output signal from the gain control amplifier functioning as a modulation signal and having a second frequency that is the same as the resonance frequency of the vibrator.

The signal (mixed signal) that is mixed into the oscillation loop and has a frequency (second frequency) higher than the resonance frequency of the vibrator is merely AM-modulated using the output signal from the gain control amplifier having a frequency (first frequency) that coincides with the resonance frequency of the vibrator. Therefore, the state in the oscillation loop does not differ to a large extent from the steady oscillation condition. As a result, the signal (mixed signal) mixed into the oscillation loop does not hinder normal oscillations.

(18) In the driver device,
the mixed signal may contain a signal component having the second frequency;

the signal component having the second frequency contained in the mixed signal may be selected as a result of frequency selection by the vibrator;

the gain control amplifier may output the output signal based on the selected signal component having the second frequency;

the modulation circuit may AM-modulate the mixed signal using the output signal from the gain control amplifier as the modulation signal; and the AM-modulated signal output from the modulation circuit may be supplied to the vibrator so that oscillations at the second frequency grow in the oscillation loop.

The mixed signal is AM-modulated using the output signal from the gain control amplifier, and the AM-modulated signal is supplied to the vibrator. A signal component having the resonance frequency (second frequency) is selected due to frequency selection by the vibrator, and the output from the gain control amplifier is generated based on the selected signal component having the second frequency. This operation is repeated, whereby normal oscillations grow reliably and promptly.

(19) In the driver device, the modulation circuit may include at least one switch provided in the oscillation loop; and the signal generation circuit may generate a switch control signal having a frequency higher than the resonance frequency of the vibrator, and the at least one switch may be turned ON/OFF based on the switch control signal.

(20) In the driver device, a rectangular-wave signal that has a state similar to an impulse and contains white noise may be mixed into the oscillation loop by turning the at least one switch ON/OFF based on the switch control signal; and a signal component having a frequency that coincides with the resonance frequency of the vibrator may be selected from the white noise contained in the rectangular-wave signal as a result of frequency selection by the vibrator, and oscillations at the resonance frequency of the vibrator may grow in the oscillation loop due to the selected signal component that serves as a cause of oscillations.

(21) In the driver device, an output signal may be output from the gain control amplifier based on the signal component that has been selected by the vibrator and has a frequency that coincides with the resonance frequency of the vibrator;

the modulation circuit may AM-modulate the rectangular-wave signal mixed into the oscillation loop using the output signal from the gain control amplifier as a modulation signal, the rectangular-wave signal having a state similar to an impulse and containing the white noise; and the AM-modulated signal output from the modulation circuit may be supplied to the vibrator.

According to any of the above embodiments (19) to (21), oscillations can be reliably and promptly caused to start merely by turning the switch ON/OFF. Since the circuit configuration is simplified, the occupied area and power consumption can be reduced. A charge/discharge current flows through the oscillation loop due to charge transfer by turning the switch ON/OFF, whereby a signal (mixed signal) having the same frequency as the ON/OFF frequency of the switch is generated in the oscillation loop. A signal component that is contained in the mixed signal and has a frequency that coincides with the resonance frequency of the vibrator is selected by the vibrator, and the output signal is output from the gain control amplifier based on the selected signal component. The modulation circuit AM-modulates the mixed signal that functions as a carrier using the output signal from the gain control amplifier as the modulation signal. The AM-modulated signal is supplied to the vibrator. This operation is repeated, whereby normal oscillations grow reliably and promptly. The mixed signal is preferably a rectangular-wave signal (pseudo-impulse) that is similar to an impulse and contains white noise.

(22) According to still another embodiment of the invention, there is provided a method of driving a vibrator using an oscillation loop including a driver element, the method comprising:

mixing a noise component that contains a resonance frequency component of the vibrator into a path in an oscillation startup state, the path connecting the vibrator and the driver element and not connected with other circuits;

selecting a frequency component that coincides with the resonance frequency of the vibrator from the noise component utilizing frequency selectivity of the vibrator; and causing oscillations to grow using the selected signal component as a cause of oscillations.

According this embodiment, energy is supplied to the vibrator from the mixed noise component. Therefore, an oscillation failure does not occur during oscillation startup. The mixed noise component necessarily contains a frequency (frequency that serves as a cause of oscillations) that coincides with the oscillation frequency of the vibrator. If the amount of mixed noise is large, a frequency component that serves as a cause of oscillations is reliably output from the vibrator even when filtered due to the frequency selectivity of the vibrator. Therefore, oscillations necessarily grow. Since oscillations grow efficiently, the period of time until a steady oscillation state is achieved after oscillation startup can be reduced. Since the noise component is mixed into a path which is not connected with other circuits, other circuits are not adversely affected by the noise component.

Embodiments of the invention are described below in detail with reference to the drawings. Note that the embodiments described below do not in any way limit the scope of the invention laid out in the claims. Note that all elements of the embodiments described below should not necessarily be taken as essential requirements for the invention.

First Embodiment

1. Driver Device

FIG. 1 is a block diagram showing a configuration example of an oscillation driver circuit (driver device) according to one embodiment of the invention. The oscillation driver circuit (driver device) according to this embodiment is used to measure a physical quantity using an output signal obtained by synchronously detecting a detection signal output from a vibrator based on driving vibrations produced by the vibrator and the physical quantity to be measured.

An oscillation driver circuit 10 includes first and second connection terminals TM1 and TM2 (electrodes or pads). A vibrator 12 is inserted between the first and second connection terminals outside the oscillation driver circuit 10. An excitation means 14 is attached to the vibrator 12. The excitation means 14 is connected with the oscillation driver circuit 10 to form an oscillation loop. An oscillation starts in a state in which the gain of a driver provided in the oscillation driver circuit 10 is large (i.e., larger than unity). In this state, only noise is input to the driver. The noise contains wave motions at a wide range of frequencies including the natural resonance frequency of the desired driving vibrations. The noise is input to the vibrator 12.

The vibrator 12 is formed of a piezoelectric single crystal as described later, for example. A signal containing a large amount of wave motions at the desired natural resonance frequency is output due to the frequency filtering effect of the vibrator 12, and is input to the driver. The above operation is repeated in the oscillation loop so that the percentage of the signal at the desired natural resonance frequency increases, whereby the amplitude of the signal input to the driver increases.

In a steady oscillation state, the output current from the vibrator 12 is converted into a voltage value using a current-voltage converter 30. The oscillation amplitude in the oscillation loop is controlled using an auto gain control (AGC) circuit (gain control circuit in a broad sense) 40 based on the voltage value, for example. This causes the gain (loop gain) while the signal goes around the oscillation loop to become unity, whereby the vibrator 12 stably oscillates.

It is indispensable to cause the vibrator to stably oscillate when measuring the physical quantity. Specifically, if the amplitude of the drive signal produced by the vibrator is not constant, the output signal from the vibrator does not become constant, whereby the physical quantity cannot be accurately measured.

It is also indispensable to accelerate the oscillation startup of the vibrator in order to reduce the power consumption of the system including the vibrator and the oscillation driver circuit. Specifically, oscillations can be produced only when required by promptly obtaining stable oscillations, whereby an operation period in which power is unnecessarily consumed can be reduced.

In this embodiment, the oscillation driver circuit 10 utilizes a gain control amplifier (hereinafter abbreviated as "GCA") 20 as the driver in the steady oscillation state, and causes the vibrator 12 to oscillate during oscillation startup using a signal modulated by a modulation circuit 90 provided in the oscillation loop including the vibrator 12.

Specifically, the oscillation driver circuit 10 includes the GCA 20 and the modulation circuit 90 provided in the oscillation loop. The oscillation driver circuit 10 further includes an impulse generation control circuit 48 as a signal generation circuit. The impulse generation control circuit 48 generates a signal at a given frequency, and supplies the generated signal to the modulation circuit 90. The modulation circuit 90 modulates the frequency of the signal generated by the impulse generation control circuit 48 to the resonance frequency of the vibrator 12. The oscillation driver circuit 10 causes the vibrator 12 to produce driving vibrations using the signal modulated by the modulation circuit 90, and then causes the vibrator 12 to produce driving vibrations by controlling the oscillation amplitude in the oscillation loop formed by the vibrator 12 and the gain control amplifier. This allows energy to be injected into the vibrator 12 during oscillation startup due to the modulated signal from the modulation circuit 90, whereby the oscillation startup time of the vibrator 12 can be reduced. Moreover, since the frequency of the modulated signal from the modulation circuit 90 is modulated to the resonance frequency of the vibrator 12, the oscillation condition does not differ to a large extent from the steady oscillation condition of the oscillation loop. Therefore, energy can be injected into the oscillation loop without hindering the oscillations of the vibrator, whereby oscillation startup can be efficiently achieved.

In the oscillation loop, the vibrator 12 generally allows only a resonance frequency component contained in white noise in the oscillation loop to pass through. As a result, only a resonance frequency signal component is amplified, whereby the vibrator 12 starts to oscillate. Specifically, a general oscillation circuit amplifies only a resonance frequency component of the vibrator 12 contained in intrinsic noise (particularly white noise) in the oscillation loop to cause the vibrator 12 to oscillate. However, intrinsic noise changes to a large extent due to changes in temperature conditions, power supply conditions, and process conditions. Therefore, the period of time until a steady oscillation state is achieved after oscillation startup also changes to a large extent due to changes in temperature conditions, power supply conditions, and process conditions. According to this embodiment, the vibrator 12 can be reliably caused to oscillate using the modulation circuit irrespective of changes in temperature conditions, power supply conditions, and process conditions, and the period of time until a steady oscillation state is achieved after oscillation startup can be reliably reduced.

In the oscillation driver circuit 10, it is desirable that the modulation circuit 90 be provided in the oscillation loop on the output side of the GCA 20 and be electrically connected with one end of the vibrator 12. This allows the signal modulated by the modulation circuit 90 to be supplied to only the vibrator 12 without being supplied to other analog circuits in the oscillation loop. Since the signal from the modulation circuit 90 serves as a noise component for other analog circuits, malfunction of the analog circuits and unnecessary power consumption can be suppressed by employing the above configuration.

Figure 17A:
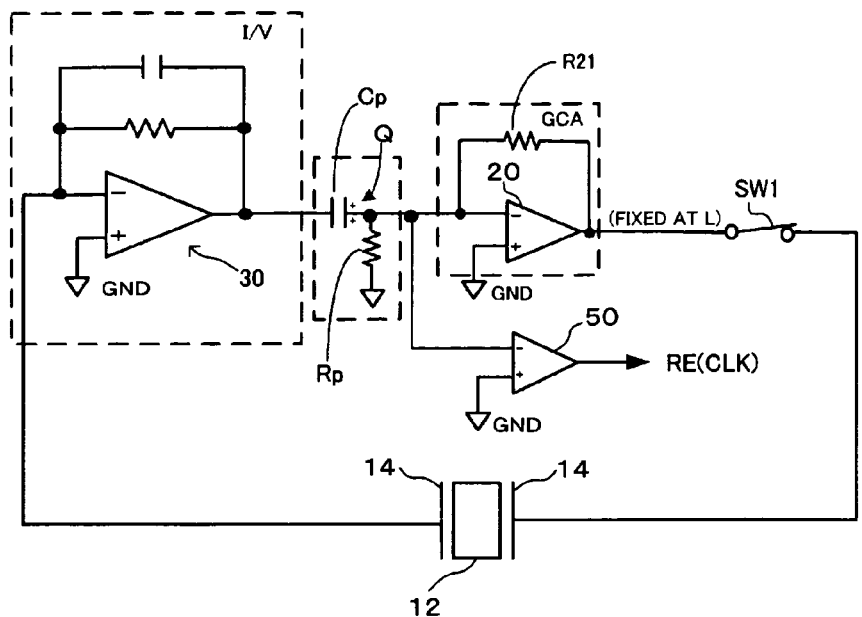
FIGS. 17A and 17B are views illustrative of a specific example of modulation performed by a modulation circuit shown in FIG. 1 and an example of its effects.
Figure 17B:
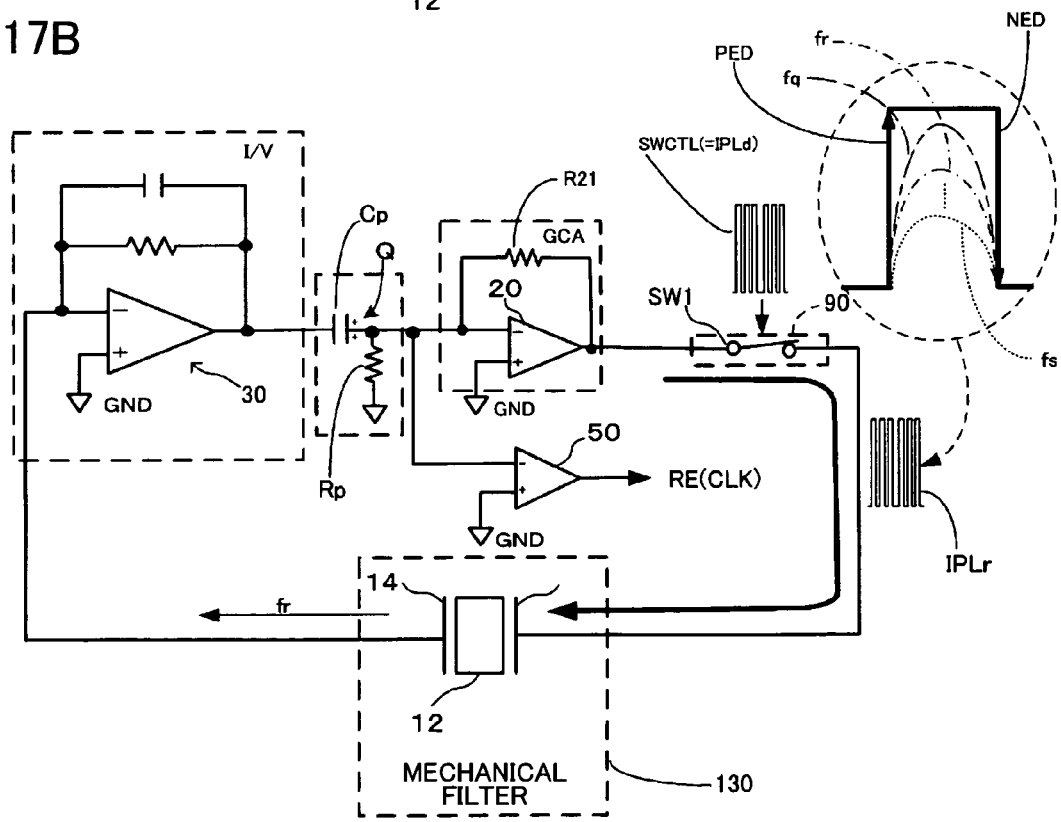

1.0 Specific Example of Modulation Performed by Modulation Circuit and Example of its Effects FIGS. 17A and 17B are views illustrative of a specific example of modulation performed by the modulation circuit shown in FIG. 1 and an example of its effects.

During oscillation startup, it is important to reliably cause the driver circuit to start the operation which implements steady oscillations by causing current to flow through the oscillation loop. Specifically, the driver circuit (oscillation driver circuit) 10 does not necessarily start the above operation even when activating the driver circuit 10 by supplying power. There may be a case where current does not flow through the oscillation loop even after supplying power, whereby steady oscillations do not occur even after a certain period of time.

FIG. 17A shows an example of the cause of such a problem. In FIG. 17A, a high-pass filter formed of a capacitor Cp and a resistor Rp is provided between a current-voltage converter (I/V) 30 and a gain control amplifier (GCA) 20. For example, when a charge Q has been stored in the capacitor Cp for some reason when power is supplied so that a non-inverting terminal of the gain control amplifier (GCA) 20 is set at a potential higher than ground (GND), the output level of the gain control amplifier (GCA) 20 is fixed at an L level, whereby current does not flow through the oscillation loop even after a certain period of time. The output level of the gain control amplifier (GCA) 20 is also fixed at an H/L level when the potentials of the non-inverting terminal and the inverting terminal are subjected to undesirable DC offset due to manufacturing variations of the internal circuit of the gain control amplifier (GCA) 20, whereby current may not flow through the oscillation loop, for example. The vibrator 12 cannot be caused to produce vibrations when such a situation occurs, whereby the physical quantity cannot be measured.

Impulse Injection

In the circuit shown in FIG. 1, an impulse (pseudo-impulse) is generated using the impulse generation control circuit 48, and at least one of a switch SW1 and a switch SW2

(i.e., elements of the modulation circuit 90) provided in the oscillation loop is driven by the impulse. This causes the switch SW1 (or switch SW2) to be repeatedly turned ON/OFF momentarily. As a result, current (charge/discharge current) is caused to flow through the oscillation loop, whereby noise is injected.

In FIG. 17A, when the switch SW1 is driven using a switch control signal (i.e., impulse drive signal IPLd), a charge/discharge current flows through the oscillation loop due to charge transfer, whereby a signal (mixed signal) having the same frequency as the ON/OFF frequency of the switch SW1 is generated in the oscillation loop. Specifically, an impulse IPLr is injected into the oscillation loop. As shown in FIG. 17B (upper right), an ideal impulse uniformly contains all frequency components (frequency components fs, fq, fr, . . . ) in the frequency band. Therefore, injection (mixing) of the impulse has the same effect as that of injection (mixing) of white noise into the oscillation loop. The impulse necessarily contains a frequency component (indicated by fr in FIG. 17) which coincides with the resonance frequency fr of the vibrator.

Specifically, the injected impulse IPLr necessarily contains a frequency component which serves as a cause of startup in the oscillation loop. Therefore, when injecting the impulse into the oscillation loop, energy is reliably injected into the oscillation loop due to the component which coincides with the resonance frequency of the vibrator 12. As shown in FIG. 17B, the vibrator 12 functions as a mechanical filter 130, and has frequency selectivity (irrespective of the type of vibrator). Even if the impulse (noise) containing all frequency components is injected, the frequencies are selected due the frequency selectivity of the vibrator 12, and only a signal component at the resonance frequency fr is output from the vibrator 12. Therefore, the pulse amplitude of the resonance frequency component increases with the passage of time, whereby steady oscillations occur. It is preferable that the noise component (impulse) containing the resonance frequency component of the vibrator 12 be mixed into a path in the oscillation loop which connects the vibrator 12 and the driver element (gain control amplifier or comparator) and to which other circuits are not connected. This prevents a situation in which other circuits are adversely affected by the mixed noise.

Analysis of Actual Circuit Operation

Figure 18A:
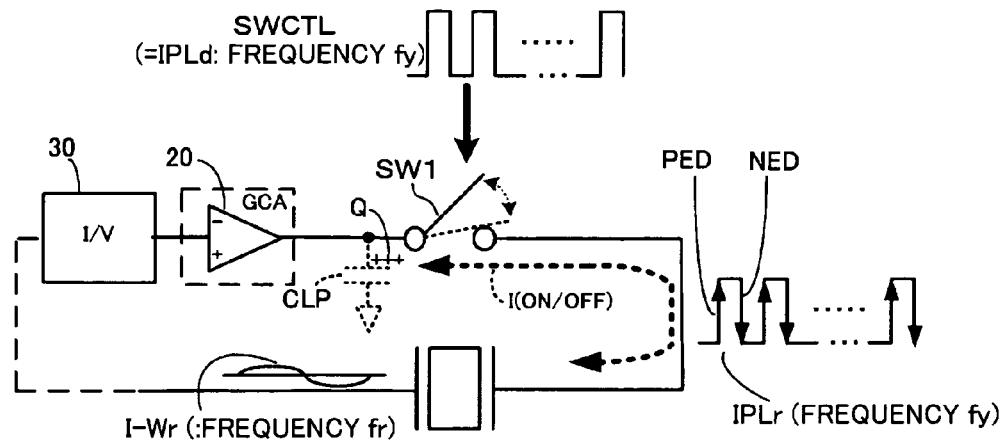
FIGS. 18A to 18C are views illustrative of an operation of mixing a pseudo-impulse into an oscillation loop.
Figure 18B:
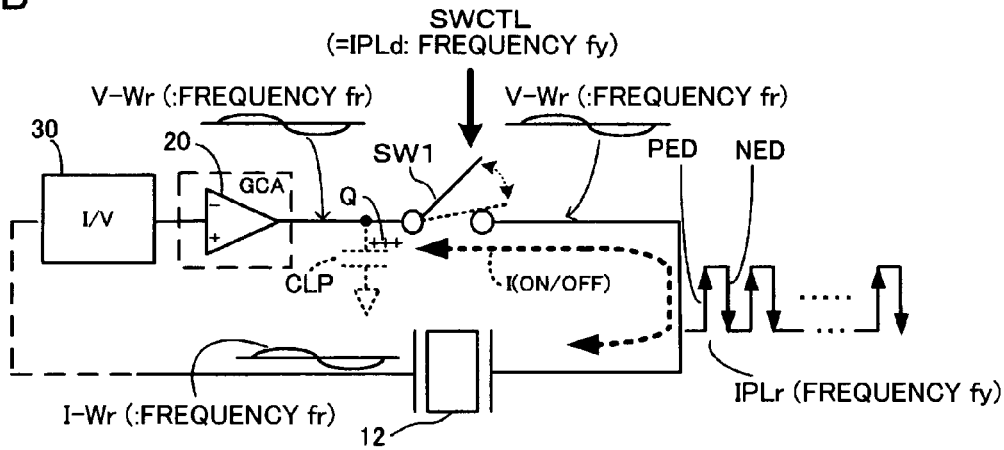
Figure 18C:
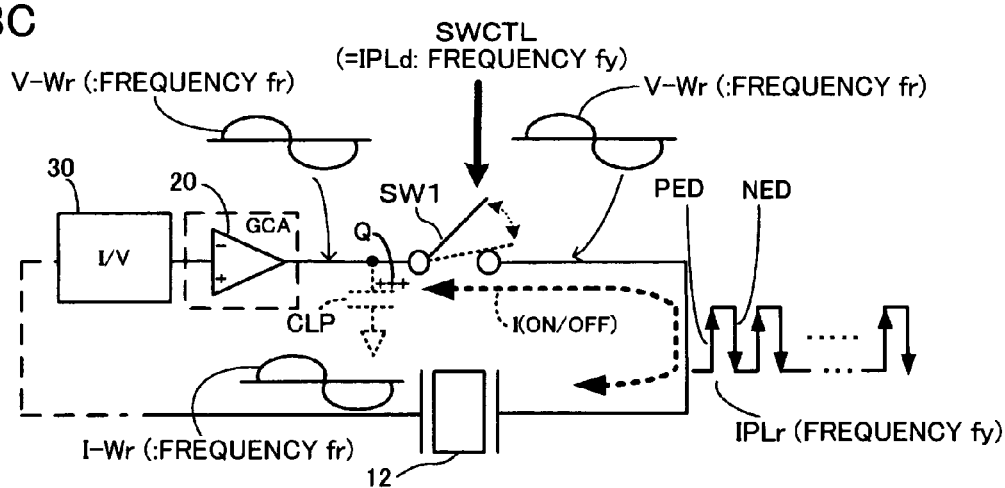

The impulse is an ideal pulse which uniformly contains all frequency components. In the actual situation, a white noise-containing rectangular wave (i.e., pseudo-impulse) similar to the impulse is mixed into the oscillation loop. This point is described below with reference to FIGS. 18A to 18C. FIGS. 18A to 18C are views illustrative of an operation of mixing (injecting) the pseudo-impulse into the oscillation loop.

In FIG. 18A, when the switch SW1 is turned ON/OFF (ON/OFF frequency is fy) using a switch control signal SWCTL, a charge/discharge current flows due to charge transfer. Specifically, a current I(ON/OFF) flows. A charge Q stored in a parasitic capacitor CLP serves as a charge supply source when the switch control signal SWCTL is initially supplied, for example. Since the current I(ON/OFF) flows in synchronization with the switch signal SWCTL (=IPLd), a rectangular wave signal IPLr occurs in the oscillation loop. A large amount of white noise component is contained at a rising edge PED and a falling edge NED of the rectangular wave signal IPLr. Therefore, if the frequency fy (e.g., 200 kHz to 1 MHz) of the switch control signal SWCTL is sufficiently higher than the resonance frequency (e.g., 20 kHz) of the vibrator 12, the number of rising edges PED and falling edges NED of the rectangular wave signal IPLr per unit time increases. Accordingly, a large amount of white noise is efficiently injected into the oscillation loop. In this case, the rectangular wave signal IPLr is considered to be a pulse similar to an ideal impulse (i.e., pseudo-impulse uniformly containing white noise).

Since the vibrator 12 has frequency selectivity, the vibrator 12 allows only a current signal component of the white noise contained in the pseudo-impulse IPLr which coincides with the resonance frequency fr to pass through. The current signal component which coincides with the resonance frequency fr is a sine-wave current signal I-Wr at a low frequency of about 20 kHz, for example. The current signal I-Wr refers to a signal Wr which has a frequency that coincides with the resonance frequency of the vibrator 12 and is a current signal.

As shown in FIG. 18B, the current signal I-Wr having a frequency that coincides with the resonance frequency fr of the vibrator 12 is subjected to current-voltage conversion by the current/voltage converter (I/V) 30 in a level-inversion manner. A voltage signal output from the current/voltage converter (I/V) 30 is inversely amplified by the gain control amplifier (GCA) 20 so that the gain in the oscillation loop becomes equal to or larger than unity. As a result, a voltage signal V-Wr which satisfies the vibrator oscillation conditions (i.e., the phase is a multiple of 360 degrees and the gain in the oscillation loop is equal to or larger than unity) is output from the gain control amplifier (GCA) 20. The voltage signal V-Wr refers to a signal Wr which has a frequency that coincides with the resonance frequency of the vibrator 12 and is a voltage signal. When the switch SW1 is turned ON (closed), the voltage signal V-Wr output from the GCA 20 is supplied to the vibrator 12.

An output terminal of the gain control amplifier (GCA) 20 is connected with the vibrator 12. Since the vibrator 12 allows only a single resonance frequency to pass through, for example, the voltage signal input to the vibrator 12 may be a sine wave or a rectangular wave signal containing the resonance frequency component of the vibrator 12 and a higher-order frequency component. Specifically, since a higher-order frequency is removed due to the frequency selectivity of the vibrator 12, the input signal may be either a sine wave or a rectangular wave.

The above operation is repeated. As shown in FIG. 18C, the amplitude of the sine-wave (or rectangular-wave) signal V-Wr output from the GCA 20 increases with the passage of time, whereby a steady oscillation state occurs.

Figure 19A:
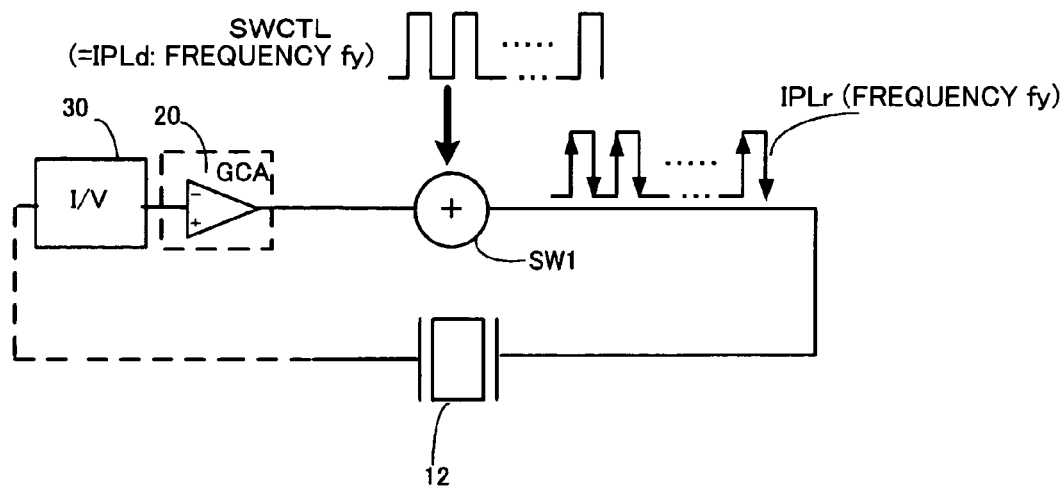
FIGS. 19A and 19B are views illustrative of a function of a switch shown in FIG. 18 as an element of a modulation circuit.
Figure 19B:
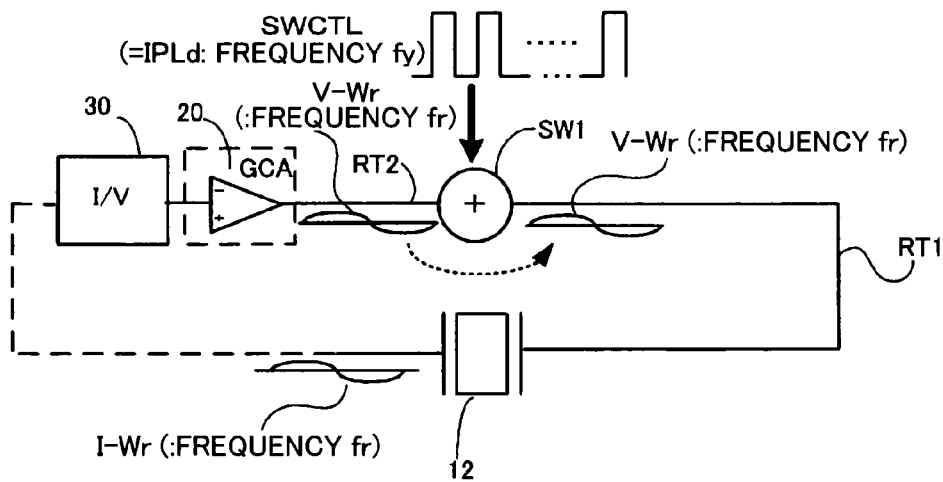

FIGS. 19A and 19B are views illustrative of the function of the switch shown in FIG. 18 as the element of the modulation circuit. The switch SW1 has two types of addition functions.

Specifically, the switch SW1 has a function of adding the pseudo-impulse IPLr based on the switch control signal SWCTL(=IPLd) to the oscillation loop, as shown in FIG. 19A. As shown in FIG. 19B, the switch SW1 also has a function of adding the signal V-Wr output from the GCA 20 to a path RT1 connected with an input terminal of the vibrator 12.

The switch SW1 performs the addition functions shown in FIGS. 19A and 19B at the same time. Therefore, the circuit configuration is significantly simplified.

Note that the invention is not limited to the above configuration. For example, rectangular-wave signals (SWCTL and IPLd) supplied from outside may be directly injected into the oscillation loop using an adder. In this case, the rectangular-wave signals (SWCTL and IPLd) supplied from outside serve as the pseudo-impulse (IPLr).

Modulation Operation of Modulation Circuit

Figure 20:
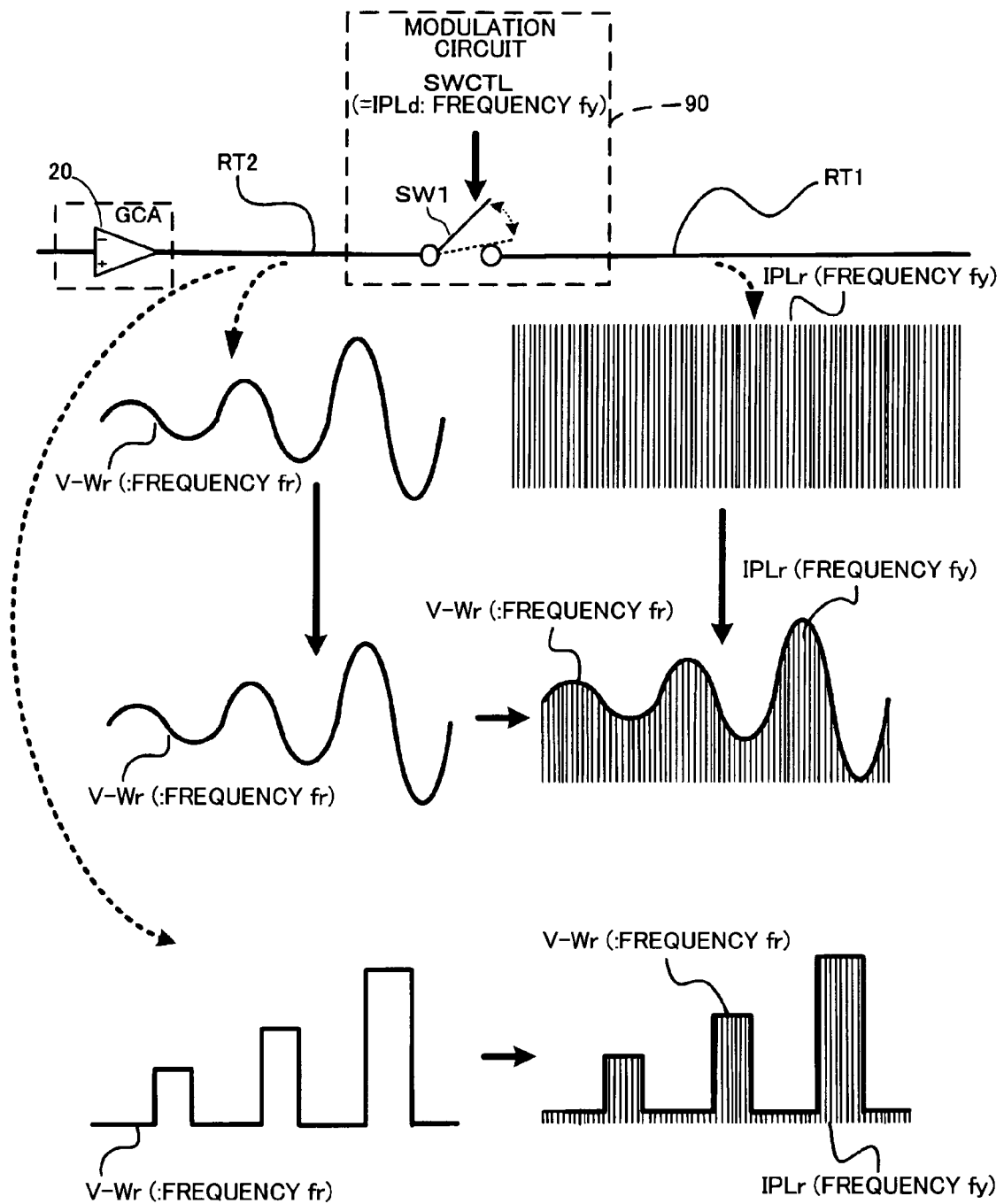
FIG. 20 is a view illustrative of a modulation operation of a modulation circuit in detail.

FIG. 20 is a view illustrative of the modulation operation of the modulation circuit in detail. As shown in FIG. 20, the pseudo-impulse IPLr having a frequency which coincides with the ON/OFF frequency fy of the switch is mixed (injected) into the path RT1 connected with the input terminal of the vibrator 12 in the oscillation loop. The GCA 20 outputs the sine-wave (or rectangular-wave) signal V-Wr having a frequency which coincides with the resonance frequency fr of the vibrator 12 to a path RT2 connected with an output terminal of the GCA 20. The amplitude of the signal V-Wr output from the GCA 20 increases with the passage of time, as described above.

When the switch SW1 is turned ON, the signal V-Wr output from the GCA 20 is added to the path RT1. As a result, the pseudo-impulse IPLr is AM-modulated by the signal V-Wr output from the GCA 20. As shown in FIG. 20, the pseudo-impulse IPLr functions as a carrier. The signal V-Wr output from the GCA 20 functions as a modulation signal. The modulated signal is supplied to the input terminal of the vibrator 12.

Figure 21:
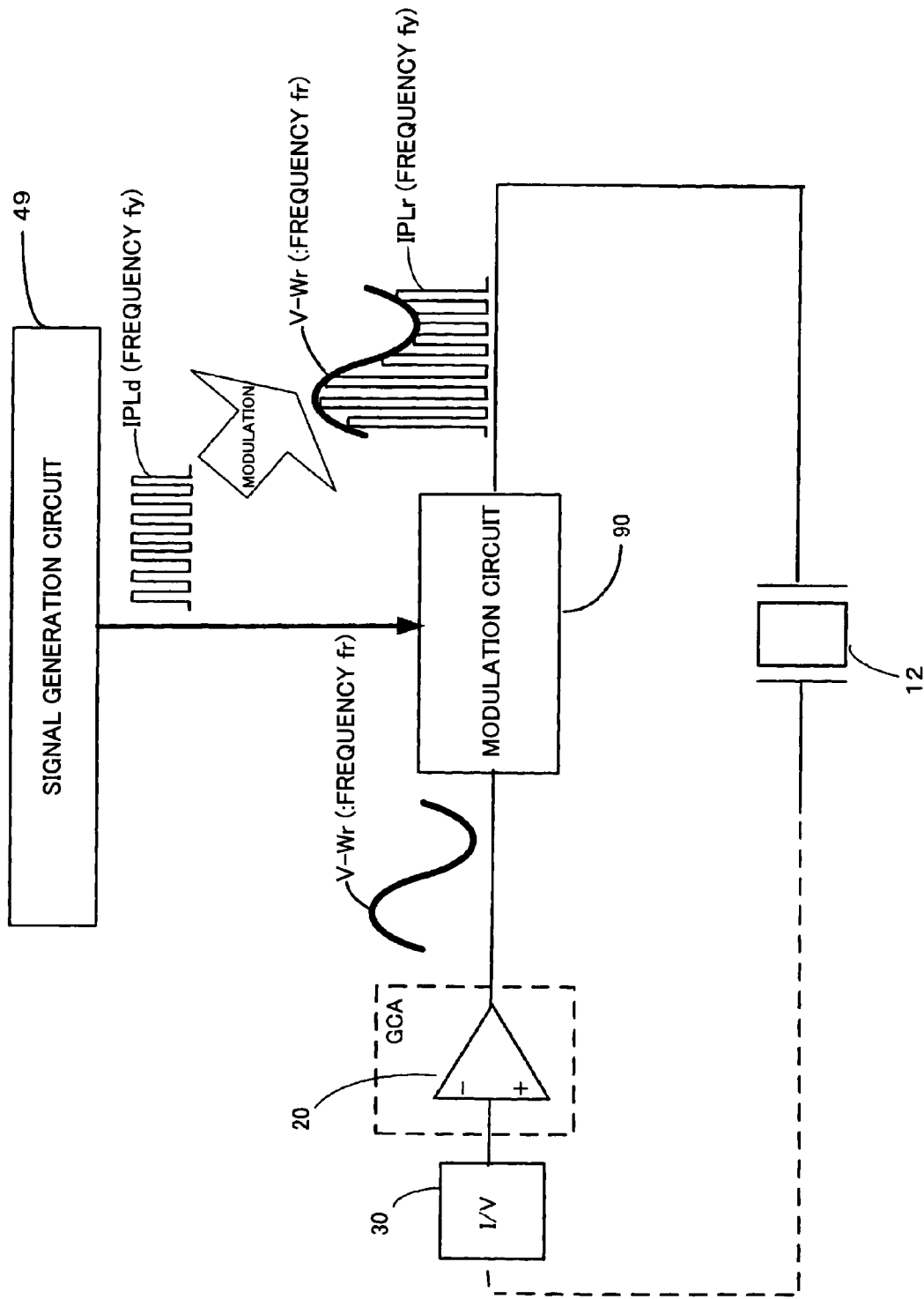
FIG. 21 is a view illustrative of a generic concept of a function of a modulation circuit.

FIG. 21 is a view illustrative of the generic concept of the function of the modulation circuit. As shown in FIG. 21, a signal generation circuit 49 (corresponding to the impulse generation control circuit 48 in FIG. 1) generates and outputs the rectangular-wave signal IPLd having the resonance frequency fy (fy>frequency fr of the vibrator). A signal which has the frequency fy and functions as a carrier is mixed (injected) into the oscillation loop based on the rectangular-wave signal IPLd. The signal may be mixed due to charge transfer caused by turning the switch SW1 ON/OFF, for example. The rectangular-wave signal IPLd may be directly mixed into the oscillation loop using another adder, for example.

The modulation circuit 90 AM-modulates the mixed (injected) signal (mixed signal) IPLr using the signal V-Wr output from the GCA 20 which functions as the modulation signal (the frequency of the signal V-Wr coincides with the resonance frequency fr of the vibrator 12).

In other words, the signal IPLd generated by the signal generation circuit 49 is converted by the modulation circuit 90 into the signal Wr having the resonance frequency fr of the vibrator 12. In this case, the frequency fy of the signal IPLd generated by the signal generation circuit 49 is modulated by the modulation circuit 90 to the resonance frequency fr of the vibrator 12. Specifically, the modulation circuit 90 modulates the frequency of the signal IPLd generated by the signal generation circuit 49 to the resonance frequency fr of the vibrator 12.

The above-described configuration of the modulation circuit is merely an example. The modulation circuit may have an arbitrary configuration insofar as the operation shown in FIG. 21 is substantially implemented. All modifications and applied circuit configurations are also included within the scope of the invention.

Figure 22:
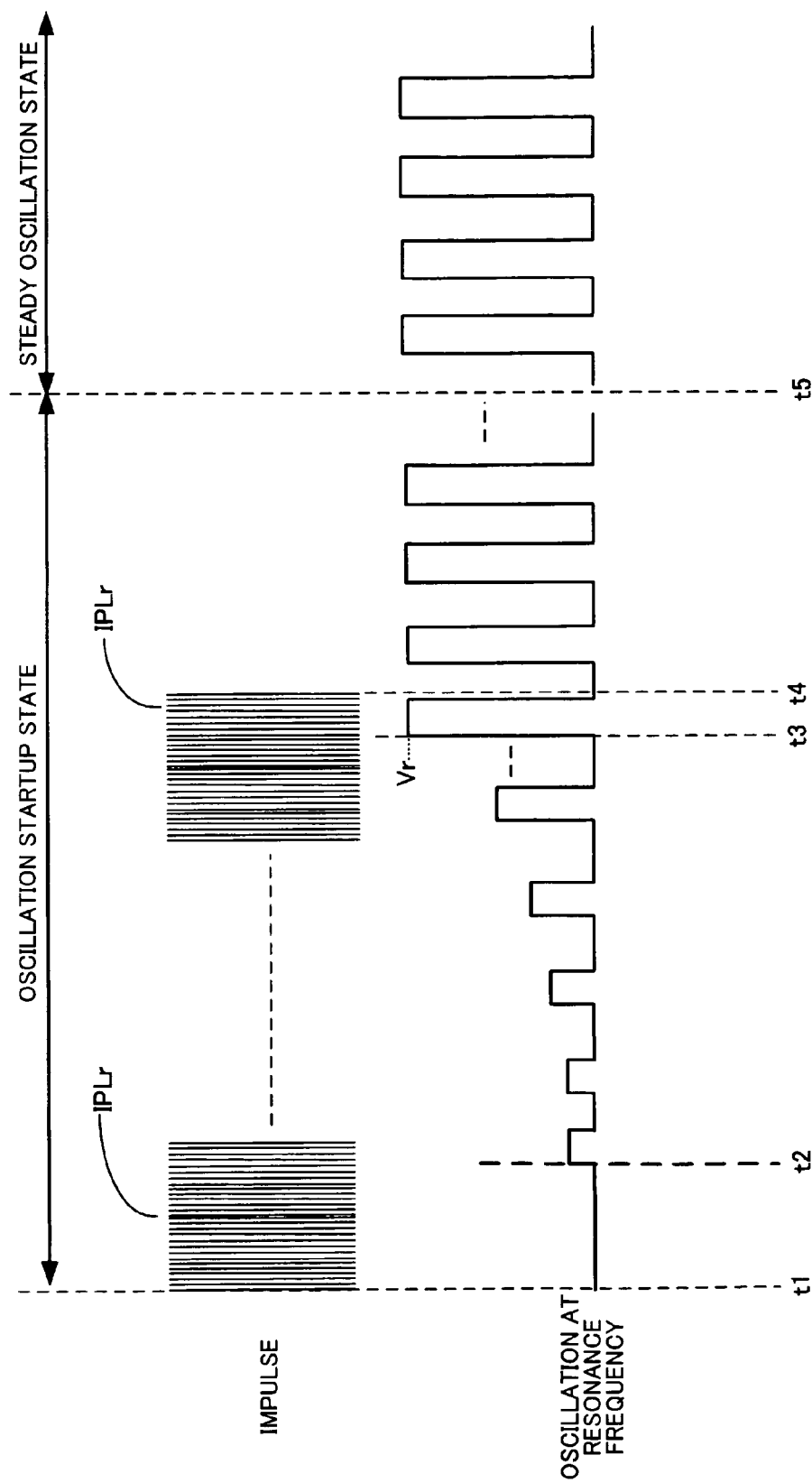
FIG. 22 is a view showing an outline of the state in an oscillation loop from oscillation startup to a steady oscillation state through an oscillation startup state.

FIG. 22 is a view showing an outline of the state in the oscillation loop from oscillation startup to the steady oscillation state through the oscillation startup state. As shown in FIG. 22, oscillation startup occurs at a time t1, and the impulse IPLr is injected into the oscillation loop by the modulation operation of the modulation circuit 90. The amplitude of the resonance frequency oscillation signal gradually increases and reaches a specific amplitude level at a time t3. The modulation operation (impulse IPLr injection operation) of the modulation circuit 90 is terminated at a time t4. The modulation operation of the modulation circuit 90 may be terminated at a timing when detecting that the amplitude of the oscillation signal at a desired frequency has reached a specific value, for example. A reference clock signal may be counted from the modulation start timing, and the modulation operation may be terminated at a timing at which a specific number of pulses of the reference clock signal has been counted. In this case, since the amplitude of the oscillation signal need not be detected, power consumption can be reduced. A steady oscillation state occurs at a time t5.

In the driver circuit 10 according to this embodiment, current necessarily flows through the oscillation loop when power is supplied, whereby the operation which implements steady oscillations starts, as described above. Therefore, an oscillation failure does not occur. Moreover, since energy is efficiently supplied to the vibrator 12 using the signal output from the modulation circuit, oscillations can be caused to grow promptly.

The above description has been given taking an example of using the impulse drive (including pseudo-impulse drive) modulation method as the modulation method of the modulation circuit 90. Note that the invention is not limited thereto. An arbitrary modulation method may be used insofar as noise containing a frequency component which coincides with the resonance frequency of the vibrator 12 can be mixed (injected) into the oscillation loop.

In FIG. 1, the impulse generation control circuit 48 turns the switches SW1 and SW2 ON/OFF. Note that the invention is not limited thereto. The impulse generation control circuit 48 may drive only one of the switches SW1 and SW2. Note that the operation characteristics of the gain control amplifier 20 generally differ from the operation characteristics of a comparator 50. Therefore, noise can be injected under different conditions by driving the switches SW1 and SW2, whereby oscillations at a desired frequency can be efficiently caused to occur.

1.1 Modulation Circuit

The modulation circuit 90 is described below.

In this embodiment, the modulation circuit 90 may include the comparator 50 which can be inserted into the oscillation loop during oscillation startup. The comparator 50 is provided in the oscillation driver circuit 10 in parallel with the GCA 20. The comparator 50 preferably has a current limiting function. When the comparator 50 is connected with a high-potential-side power supply and a low-potential-side power supply, the current limiting function of the comparator 50 may be referred to as a function of limiting current flowing through a current path connected to at least one of the high-potential-side power supply and the low-potential-side power supply. The oscillation driver circuit 10 including the modulation circuit 90 may output the output from the comparator 50 as a synchronous detection clock signal (synchronous detection reference signal).

The modulation circuit 90 includes the first switching element SW1 inserted between the output of the GCA 20 and the second connection terminal TM2. The first switching element SW1 is ON/OFF-controlled using the switch control signal SWCTL. The modulation circuit 90 also includes the second switching element SW2 inserted between the output of the comparator 50 and the second connection terminal TM2. The second switching element SW2 is ON/OFF-controlled using a switch control signal SWCTL#. The switch control signal SWCTL# is an inversion signal of the switch control signal SWCTL. The switch control signal SWCTL is generated by the impulse generation control circuit 48.

According to the above configuration, the modulation circuit 90 can cause the vibrator 12 to produce driving vibrations during oscillation startup while switching between the output from the GCA 20 and the output from the comparator 50 based on the switch control signal SWCTL. In the modulation circuit 90, an oscillation loop is formed by the vibrator 12 and the GCA 20 based on the switch control signals SWCTL and SWCTL#. The GCA 20 controls the oscillation amplitude in the oscillation loop to cause the vibrator 12 to produce driving vibrations. Specifically, the modulation circuit 90 functions as an adder which adds the switch control signal SWCTL to the oscillation signal in the oscillation loop by switch-controlling the first and second switching elements SW1 and SW2. The frequency of the switch control signal SWCTL can be modulated to the resonance frequency of the vibrator 12 by the function of the adder.

A high-frequency signal is introduced into the oscillation loop by switch-controlling the first and second switching elements SW1 and SW2 based on the switch control signal SWCTL generated by the impulse generation control circuit 48. Therefore, a high-frequency signal is supplied to the vibrator 12 as a startup signal.

Since an ideal impulse signal contains all frequency components, an ideal impulse signal necessarily contains a frequency component which serves as a cause of startup in the oscillation loop. Therefore, when injecting the impulse signal into the oscillation loop, energy is reliably injected into the oscillation loop due to a component which coincides with the resonance frequency of the vibrator 12. On the other hand, it is difficult to generate an ideal impulse signal. In this embodiment, a high-frequency signal generated by the above switch control is used as a pseudo-impulse signal so that the vibrator 12 starts up reliably and smoothly, whereby the oscillation startup time is reduced.

1.2 Sleep Mode

The oscillation driver circuit 10 according to this embodiment has a normal mode for performing a normal operation (first operation mode in a broad sense) and a sleep mode for performing a sleep operation (second operation mode in a broad sense) as operation modes in order to reduce power consumption. A sleep mode setting register 80 is provided inside or outside the oscillation driver circuit 10. A control circuit (not shown) which controls the oscillation driver circuit 10 sets control data in the sleep mode setting register 80. The oscillation driver circuit 10 operates in an operation mode corresponding to the control data set in the sleep mode setting register 80. For example, when "0" is set in the sleep mode setting register 80, the oscillation driver circuit 10 operates in the normal mode. For example, when "1" is set in the sleep mode setting register 80, the oscillation driver circuit 10 operates in the sleep mode.

A sleep control signal SLEEP corresponding to the control data set in the sleep mode setting register 80 is supplied to the GCA 20, an AGC circuit 40, and the impulse generation control circuit 48. When the oscillation driver circuit 10 operates in the sleep mode, the operations of the GCA 20 and the AGC circuit 40 are suspended. In this embodiment, the current-voltage converter 30 and the comparator 50 operate without being disabled (i.e., an enabled state is maintained) when the oscillation driver circuit 10 operates in the sleep mode.

The AGC circuit 40 includes a full-wave rectifier 42, an oscillation detector 44, and an integrator 46. The full-wave rectifier 42 converts the voltage value converted by the current-voltage converter 30 into a voltage value as a direct-current signal. The oscillation detector 44 detects whether or not the oscillation loop including the vibrator 12 is in an oscillation state based on the voltage value converted by the full-wave rectifier 42, and the impulse generation control circuit 48 generates the switch control signal SWCTL using the detection result of the oscillation detector 44. For example, the oscillation detector 44 compares the voltage value converted by the full-wave rectifier 42 with a given reference voltage value, and the impulse generation control circuit 48 generates the switch control signal SWCTL based on the comparison result of the oscillation detector 44. The integrator 46 generates a control signal VCTL for the GCA 20 to control oscillations in the oscillation loop based on an integration result of the voltage value converted by the full-wave rectifier 42. For example, the integrator 46 integrates the voltage value converted by the full-wave rectifier 42 to determine the level of the direct-current component, compares the determined level with a given reference signal level, and generates the control signal VCTL based on the comparison result. For example, the high-potential-side power supply voltage of a circuit (output circuit) in the output stage (final stage) of the GCA 20 is controlled based on the control signal VCTL.

Specifically, the sleep control signal SLEEP is supplied to the full-wave rectifier 42, the oscillation detector 44, and the integrator 46. The operations of the full-wave rectifier 42, the oscillation detector 44, and the integrator 46 are suspended when the sleep mode is designated by the sleep control signal SLEEP. The full-wave rectifier 42, the oscillation detector 44, and the integrator 46 operate when the normal mode is designated by the sleep control signal SLEEP.

In this embodiment, when the normal mode is set in the sleep mode setting register 80, the vibrator 12 is activated during oscillation startup by controlling the first and second switching elements SW1 and SW2, and the oscillation amplitude in the oscillation loop including the vibrator 12 and the GCA 20 is controlled in a steady oscillation state in a state in which the first switching element SW1 is turned ON and the second switching element SW2 is turned OFF. In this embodiment, oscillations are allowed to continue in the oscillation loop including the vibrator 12 and the comparator 50 when the sleep mode is set in the sleep mode setting register 80. In this case, the AGC circuit 40 monitors the oscillation state and controls the oscillation amplitude of the GCA 20.

Figure 2A:
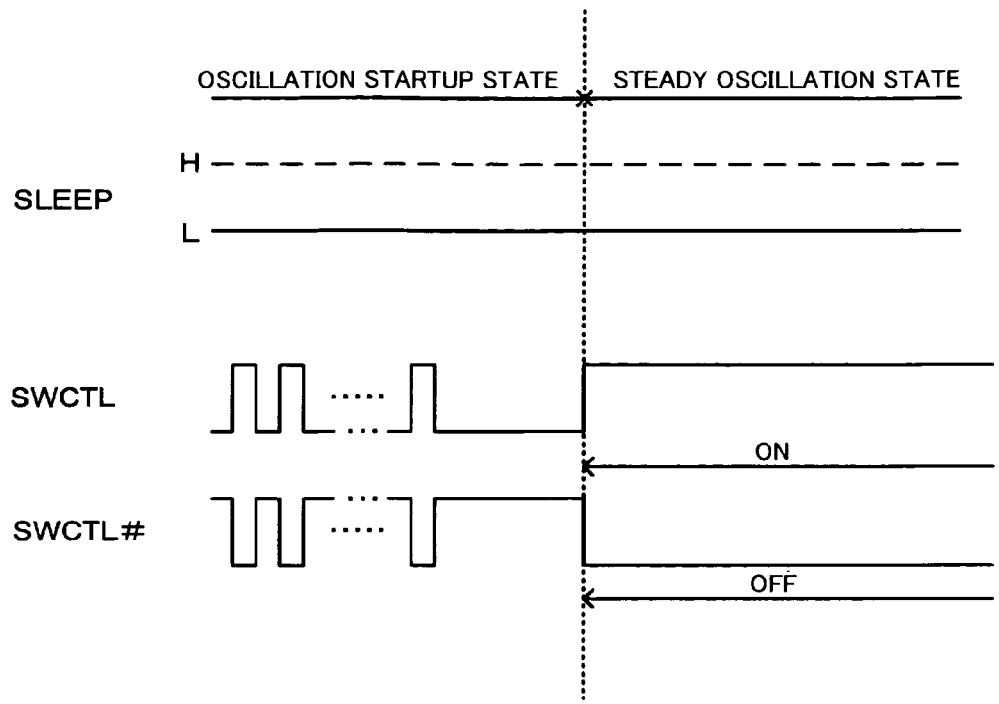
FIGS. 2A and 2B are timing diagrams showing an example of a sleep control signal and switch control signals shown in FIG. 1.
Figure 2B:
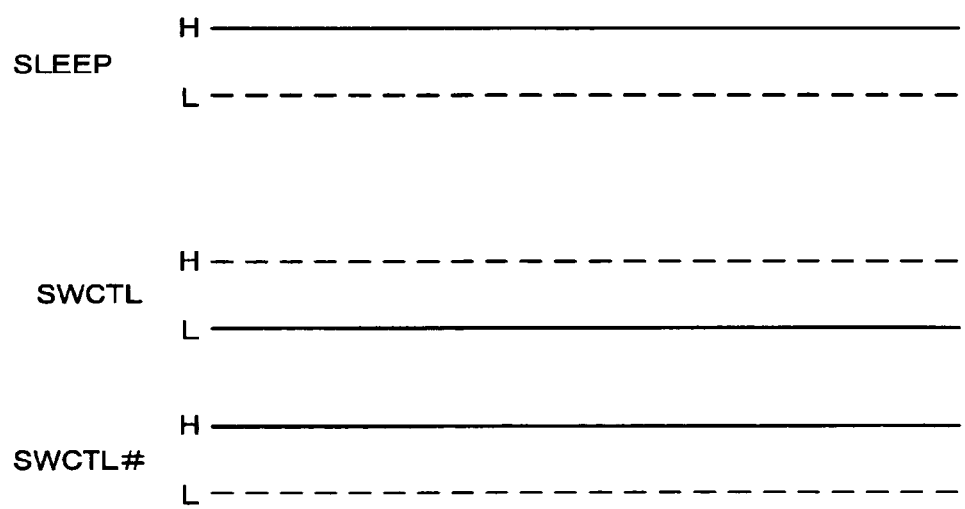

FIGS. 2A and 2B are timing waveform diagrams of the sleep control signal SLEEP and the switch control signals SWCTL and SWCTL#.

FIG. 2A is a timing waveform diagram in the normal mode, and FIG. 2B is a timing waveform diagram in the sleep mode.

In FIG. 2A, the oscillation driver circuit 10 operates in the normal mode when the sleep control signal SLEEP is set at the L level. In the oscillation startup state immediately after supplying power, the oscillation detector 44 of the AGC circuit 40 has detected that a voltage value obtained by converting a current signal from the vibrator 12 is lower than a given reference voltage value. The impulse generation control circuit 48 which has received a detection result signal ODET from the oscillation detector 44 generates the switch control signal SWCTL which has one or more pulses during a specific period. This causes the first and second switching elements SW1 and SW2 to be alternately turned ON during the specific period. In this case, energy can be injected into the vibrator 12 using a pseudo-impulse signal, and the gain in the oscillation loop can be set to be larger than unity. As a result, the vibrator 12 is caused to produce driving vibrations during the oscillation startup state so that the gain in the oscillation loop is larger than unity and the phase in the oscillation loop is 360×n (n is an integer).

The start timing of the specific period in which the impulse generation control circuit 48 changes the switch control signal SWCTL in a pulsed manner may be the power-on reset start timing of the oscillation driver circuit 10.

When the oscillation state approaches a steady oscillation state, the oscillation detector 44 detects that the voltage value obtained by converting the current signal from the vibrator 12 is higher than the given reference voltage value. The impulse generation control circuit 48 which has received the detection result signal ODET from the oscillation detector 44 generates the switch control signal SWCTL so that the first switching element SW1 is turned ON and the second switching element SW2 is turned OFF. Specifically, the finish timing of the specific period in which the impulse generation control circuit 48 changes the switch control signal SWCTL in a pulsed manner may be the timing at which it has been detected that the signal in the oscillation loop has exceeded a specific threshold value level.

As a result, the oscillation driver circuit 10 transitions from the oscillation startup state to a steady oscillation state. The oscillation amplitude in the oscillation loop is controlled by the GCA 20 based on the control signal VCTL from the AGC circuit 40 so that the gain in the oscillation loop becomes unity. In the steady oscillation state, the vibrator 12 is caused to produce driving vibrations so that the gain in the oscillation loop including the vibrator 12 and the GCA 20 is unity and the phase in the oscillation loop is 360×n.

As described above, the above switch control is performed on condition that the oscillation detector 44 has detected that the direct-current voltage obtained by converting the current flowing through the vibrator 12 has reached a given threshold voltage. This enables the switching element to be switch-controlled utilizing the signal detection result from the vibrator 12 which is generally used to control oscillations in the oscillation loop, whereby a high-speed oscillation startup can be implemented without increasing the circuit scale to a large extent.

In FIG. 2B, the oscillation driver circuit 10 operates in the sleep mode when the sleep control signal SLEEP is set at the H level. In this case, the oscillation detector 44 generates the switch control signal SWCTL set at the L level irrespective of whether the oscillation driver circuit 10 is in the oscillation startup state (such as immediately after supplying power) or the steady oscillation state. This causes the first switching element SW1 to be turned OFF and the second switching element SW2 to be turned ON. Specifically, the oscillation driver circuit 10 is set in the same state as the oscillation startup state in the normal mode shown in FIG. 2A. In this case, when the level of the signal input to the comparator 50 has exceeded a given threshold value, the comparator 50 amplifies the input signal by a very large gain to set the gain in the oscillation loop to be larger than unity. As a result, the oscillation driver circuit 10 can immediately transition to the steady oscillation state. This makes it possible to suspend the operation of the AGC circuit 40 in the sleep mode to reduce power consumption. In the sleep mode, the oscillation state continues in the oscillation loop used during the oscillation startup state in the normal mode. Therefore, a high-speed oscillation startup can be achieved when the operation mode transitions from the sleep mode to the normal mode. Therefore, a driver device can be provided which can reduce the oscillation startup time without increasing the circuit scale when the driver device can operate in the sleep mode.

Note that a reliable and quicker oscillation startup may be performed when the operation mode transitions from the sleep mode to the normal mode using the switch control signal SWCTL from the impulse generation control circuit 48.

Figure 3:
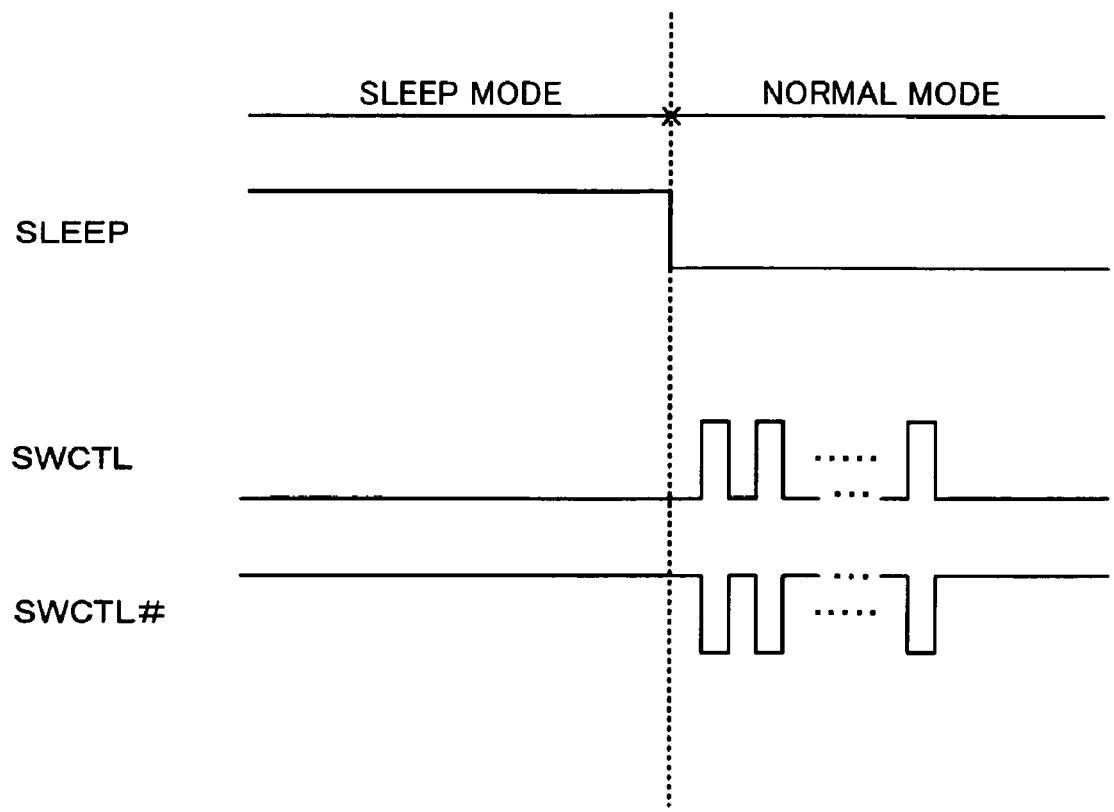
FIG. 3 is another timing waveform diagram of the sleep control signal and the switch control signals.

FIG. 3 is another timing waveform diagram of the sleep control signal SLEEP and the switch control signals SWCTL and SWCTL#.

In this case, the start timing of the specific period in which the impulse generation control circuit 48 changes the switch control signal SWCTL in a pulsed manner is the switch timing from the sleep mode to the normal mode, and a pulsed switch control signal SWCTL is generated during the specific period which starts based on the switch timing. This makes it possible to reliably reduce the oscillation startup time when recovering from the sleep mode. In this case, since the switch control signal SWCTL is used, the frequency of the signal is modulated to the resonance frequency of the vibrator 12 so that the oscillation condition does not differ to a large extent from the steady oscillation condition of the oscillation loop. Therefore, energy can be injected into the oscillation loop without hindering the oscillations of the vibrator. Therefore, oscillation startup can be efficiently achieved.

1.3 Current Limiting Function

When controlling the oscillation amplitude in the oscillation loop as described in this embodiment, current flowing through the vibrator 12 changes. The vibrator 12 may break when an excessive current flows through the vibrator 12 (e.g. when the current exceeds a given threshold value). In particular, when disabling the operation of the AGC circuit 40 in the sleep mode as described in this embodiment, the amplitude of the oscillation signal in the oscillation loop is not controlled, whereby an excessive current may flow through the vibrator 12.

In this embodiment, the comparator 50 has the current limiting function. The term "current limiting function" may be referred to as a limiter function which prevents the current flowing through the vibrator 12 from reaching or exceeding a given value, for example.

As a comparative example, a method may be considered in which a protective resistor is inserted into the oscillation loop without operating the AGC circuit, for example. However, this method has a problem in that the gain in the oscillation loop decreases in the steady oscillation state, whereby power consumption increases. Moreover, the oscillation margin cannot be increased due to the low accuracy of the resistance of the protective resistor.

On the other hand, since the oscillation signal in the oscillation loop has a given amplitude during the operation in the sleep mode by providing the current limiting function, a situation in which an excessive current flows through the vibrator 12 can be prevented while reducing power consumption without enabling the operation of the AGC circuit 40.

When the oscillation driver circuit 10 includes the AGC circuit 40 which controls the gain of the GCA 20 based on the oscillation signal in the oscillation loop, the oscillation driver circuit 10 can disable the operations of the GCA 20 and the AGC circuit 40 without disabling the operation the comparator 50 (i.e., while enabling the operation of the comparator 50) when the oscillation driver circuit 10 is set in the sleep mode. In this case, since the operation of the AGC circuit 40 is not enabled, a situation in which an excessive current flows through the vibrator 12 can be prevented while reducing power consumption.

In this embodiment, the output from the comparator 50 is output as the synchronous detection clock signal in the steady oscillation state in the normal mode. Therefore, when measuring the physical quantity using the output signal obtained by synchronously detecting the detection signal output from the vibrator 12 based on driving vibrations produced by the vibrator 12 and the physical quantity to be measured, the synchronous detection process and oscillation startup can be accelerated without increasing the circuit scale.

It is preferable that the comparator 50 have a gain as large as possible. This makes it possible to increase the loop gain in the oscillation loop formed in the oscillation startup state, whereby the oscillation startup time can be reduced. Moreover, the accuracy of the synchronous detection clock signal output in the steady oscillation state can be increased.

It is preferable that the polarity (inversion and non-inversion) of the operational amplifier forming the GCA 20 be the same as the polarity of the operational amplifier forming the comparator 50. This makes it unnecessary to provide a circuit which reverses polarity, even if the oscillation loop is switched using the first and second switching elements SW1 and SW2, whereby an increase in circuit scale can be suppressed.

1.4 Specific Configuration Example

Figure 4:
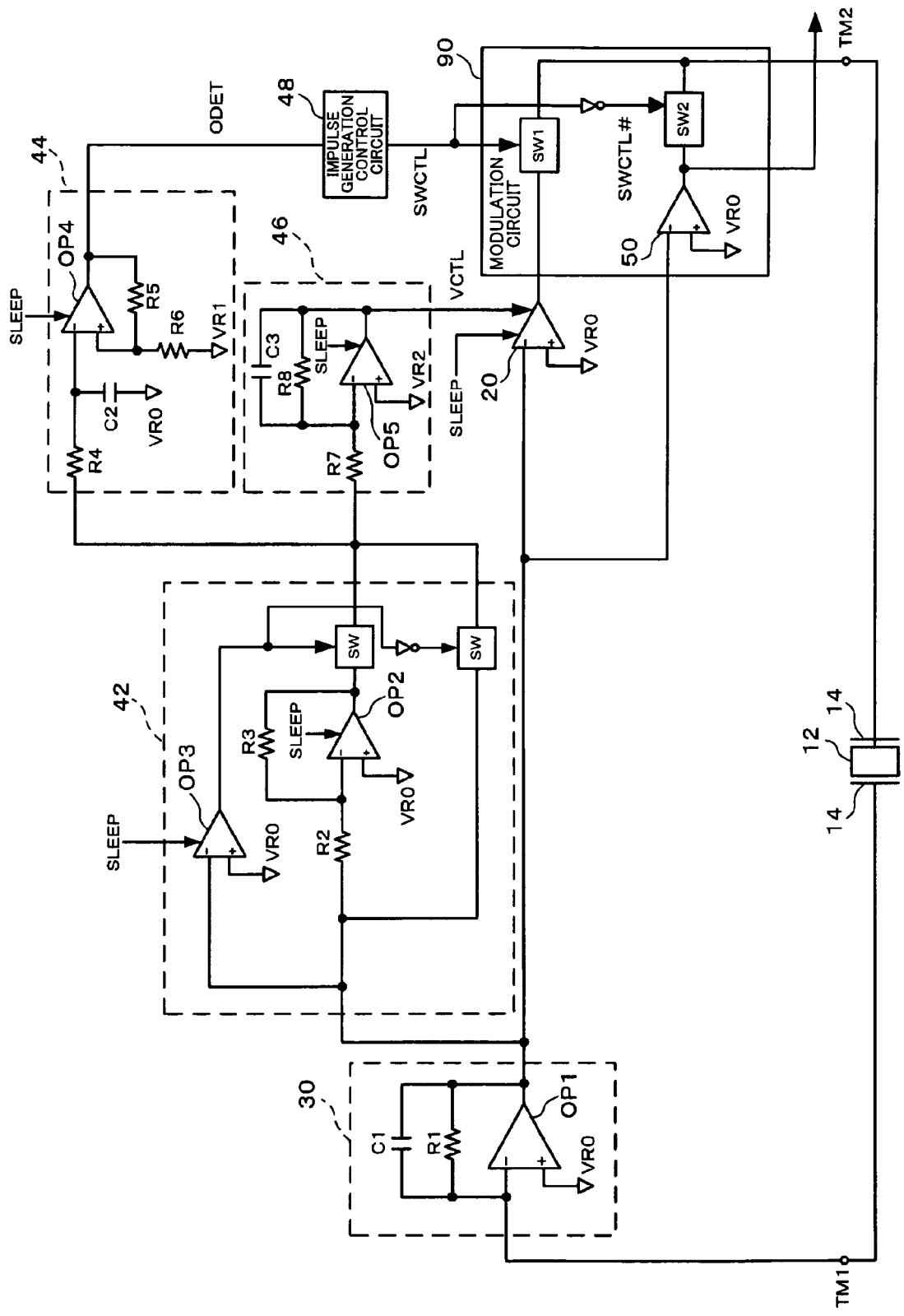
FIG. 4 is a view showing a circuit example of the oscillation driver circuit shown in FIG. 1.

FIG. 4 is a circuit diagram showing a configuration example of the oscillation driver circuit 10 shown in FIG. 1. In FIG. 4, the same sections as in FIG. 1 are indicated by the same symbols. Description of these sections is appropriately omitted.

The current-voltage converter 30 includes an operational amplifier OP1, a feedback capacitor C1, and a feedback resistor R1. A given reference voltage VR0 is supplied to the non-inverting input terminal (+) of the operational amplifier OP1, and the first connection terminal TM1 is electrically connected with the inverting input terminal (−).

The full-wave rectifier 42 includes operational amplifiers OP2 and OP3 and resistors R2 and R3. The operational amplifier OP2 and the resistors R2 and R3 function as an inverting circuit. The operational amplifier OP3 functions as a comparator which compares the output voltage of the current-voltage converter 30 with the reference voltage VR0. The full-wave rectifier 42 includes a switching element provided on the output side of the operational amplifier OP2, and a switching element which bypasses the input and the output of the full-wave rectifier 42. These switching elements are exclusively ON/OFF-controlled based on the output signal from the operational amplifier OP3. When the sleep control signal SLEEP is set at the H level, the operations of the operational amplifiers OP2 and OP3 are stopped by terminating or limiting the operating currents of the operational amplifiers OP2 and OP3. When the sleep control signal SLEEP is set at the L level, the operational amplifiers OP2 and OP3 are operated by generating the operating currents of the operational amplifiers OP2 and OP3.

The oscillation detector 44 includes a low pass filter (hereinafter abbreviated as "LPF") and an operational amplifier OP4. The LPF includes a resistor R4 and a capacitor C2. The resistor R4 is inserted in series between the input and the output of the LPF. One end of the capacitor C2 is electrically connected with the output node of the LPF. A reference voltage VR1 is supplied to the other end of the capacitor C2. The cut-off frequency of the LPF is $1/(2\pi \times C2 \times R4)$. The output node of the LPF is connected with the inverting input terminal of the operational amplifier OP4. A resistor R5 is inserted as a feedback resistor between the output and the non-inverting input terminal of the operational amplifier OP4. The reference voltage VR1 is supplied to the non-inverting input terminal of the operational amplifier OP4 through a resistor R6. The output signal from the operational amplifier OP4 is output as the detection result signal ODET. When the sleep control signal SLEEP is set at the H level, the operation of the operational amplifier OP4 is stopped by terminating or limiting the operating current of the operational amplifier OP4. When the sleep control signal SLEEP is set at the L level, the operational amplifier OP4 is operated by generating the operating current of the operational amplifier OP4.

The integrator 46 includes an operational amplifier OP5, resistors R7 and R8, and a capacitor C3. The capacitor C3 is connected as a feedback capacitor of the operational amplifier OP5. The resistor R8 is inserted as a feedback resistor of the operational amplifier OP5. The resistor R7 is inserted between the inverting input terminal of the operational amplifier OP5 and the output node of the full-wave rectifier 42. In the integrator 46, the gain is controlled while reducing the effects of the input voltage offset and the input current offset using the resistors R7 and R8. A reference voltage VR2 is supplied to the non-inverting input terminal of the operational amplifier OP5. The integrator 46 functions as an LPF utilizing the capacitor C3 and the resistor R8. The cut-off frequency is $1/(2\pi \times C3 \times R8)$. The output signal from the operational amplifier OP5 is supplied to the GCA 20 as the control signal VCTL. When the sleep control signal SLEEP is set at the H level, the operation of the operational amplifier OP5 is stopped by terminating or limiting the operating current of the operational amplifier OP5. When the sleep control signal SLEEP is set at the L level, the operational amplifier OP5 is operated by generating the operating current of the operational amplifier OP5.

The current which flows through the vibrator 12 in the oscillation startup state is referred to as Id, and the current which flows through the vibrator 12 in the steady oscillation state is referred to as Id'. The reference voltage VR2 is expressed by the following equation taking into account the smoothing by the current-voltage converter 30.

$$VR2 = (Id \times R1 \times 2/\pi) + VR0 \qquad (1)$$

where, R1 indicates the resistance of the feedback resistor of the current-voltage converter 30. Likewise, the reference voltage VR1 is expressed by the following equation.

$$VR1 = (Id' \times R1 \times 2/\pi) + VR0 \qquad (2)$$

Since Id'<Id, the reference voltage VR2 is higher than the reference voltage VR1. It is preferable that the reference voltages VR1 and VR2 have the following relationship with the reference voltage VR0.

$$VR0 < VR1 < VR2 \qquad (3)$$

When the sleep control signal SLEEP is set at the H level, the operation of the GCA 20 is stopped by terminating or limiting the operating current of the GCA 20. When the sleep control signal SLEEP is set at the L level, the GCA 20 is operated by generating the operating current of the GCA 20.

Figure 5A:
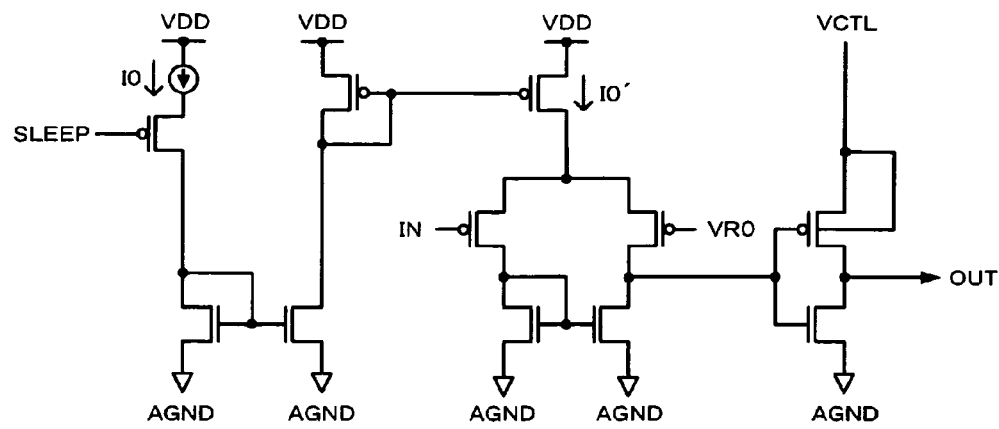
FIGS. 5A and 5B are circuit diagrams showing a configuration example of a GCA.
Figure 5B:
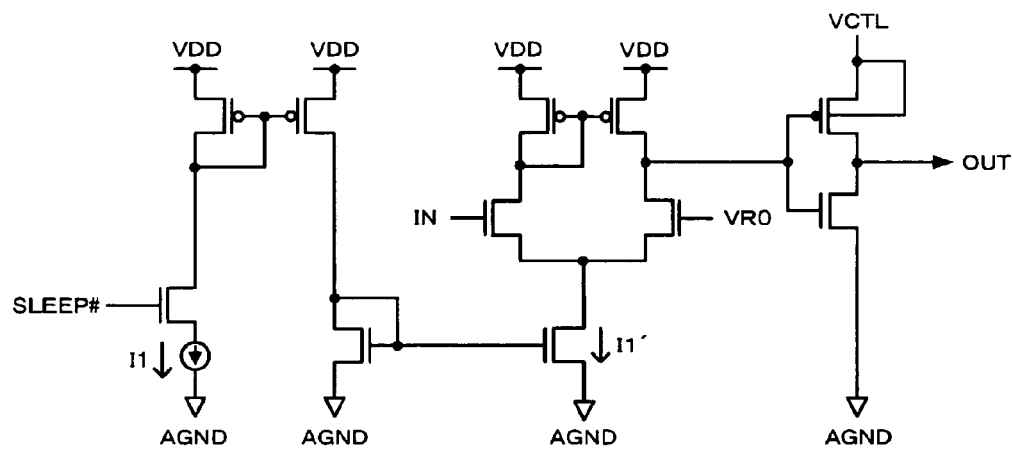

FIGS. 5A and 5B are circuit diagrams showing a configuration example of the GCA 20 shown in FIG. 4.

FIG. 5A shows a configuration example when forming the GCA 20 using a P-type differential amplifier, and FIG. 5B shows a configuration example when forming the GCA 20 using an N-type differential amplifier. In FIGS. 5A and 5B, a sleep control signal SLEEP# is an inversion signal of the sleep control signal SLEEP.

In FIG. 5A, a current I0 generated by a current source is supplied as an operating current I0' of the P-type differential amplifier through two current-mirror circuits. The voltage of the output node of the current-voltage converter 30 is supplied to the gate of one of a pair of P-type differential transistors of the P-type differential amplifier as an input signal IN. The reference voltage VR0 is supplied to the gate of the other P-type differential transistor of the P-type differential amplifier. The output voltage of the P-type differential amplifier is supplied to an output buffer. The signal output from the output buffer is supplied to one end of the first switching element SW1.

The high-potential-side power supply voltage and the low-potential-side power supply voltage of the two current-mirror circuits and the P-type differential amplifier are voltages VDD and AGND, respectively. The output buffer is an inverter circuit including a P-type output transistor and an N-type output transistor. The voltage AGND is supplied to the source of the N-type transistor of the output buffer, and the control signal VCTL from the AGC circuit 40 is supplied to the source of the P-type transistor. Therefore, the output voltage of the output buffer can be changed by changing the control signal VCTL.

In FIG. 5B, a current I1 generated by a current source is supplied as an operating current I1' of the N-type differential amplifier through two current-mirror circuits. The voltage of the output node of the current-voltage converter 30 is supplied to the gate of one of a pair of N-type differential transistors of the N-type differential amplifier as the input signal IN. The reference voltage VR0 is supplied to the gate of the other N-type differential transistor of the N-type differential amplifier. The output voltage of the N-type differential amplifier is supplied to an output buffer. The signal output from the output buffer is supplied to one end of the first switching element SW1.

The high-potential-side power supply voltage and the low-potential-side power supply voltage of the two current-mirror circuits and the N-type differential amplifier are the voltages VDD and AGND, respectively. The output buffer is an inverter circuit including a P-type output transistor and an N-type output transistor. The voltage AGND is supplied to the source of the N-type transistor of the output buffer, and the control signal VCTL from the AGC circuit 40 is supplied to the source of the P-type transistor. Therefore, the output voltage of the output buffer can be changed by changing the control signal VCTL.

In FIGS. 5A and 5B, a substrate bias effect can be prevented by applying the control signal VCTL as the substrate potential of the P-type output transistor of the output buffer.

In FIGS. 5A and 5B, a current control transistor is provided in series with the current source. In FIG. 5A, the current source transistor is formed of a P-type transistor, and the sleep control signal SLEEP is supplied to the gate of the transistor. In FIG. 5B, the current source transistor is formed of an N-type transistor, and the sleep control signal SLEEP# is supplied to the gate of the transistor. According to the configurations shown in FIGS. 5A and 5B, the source and the drain of the current control transistor are electrically disconnected when the sleep control signal SLEEP is set at the H level, whereby the current generated by the current source is not supplied to the current-mirror circuit. Therefore, the operation of the GCA 20 can be disabled (stopped) based on the sleep control signal SLEEP.

A configuration which implements the current limiting function of the comparator 50 is described below. The power supply voltage VDD is supplied to the comparator 50 as the high-potential-side power supply. The analog power supply voltage AGND is supplied to the comparator 50 as the low-potential-side power supply. The current limiting function of the comparator 50 is a function of limiting current which flows through a current path connected to at least one of the high-potential-side power supply and the low-potential-side power supply.

Figure 6:
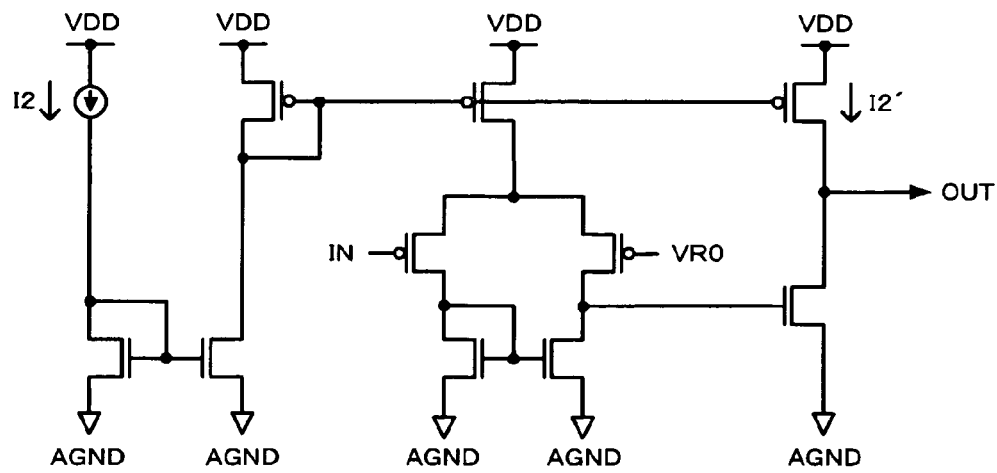
FIG. 6 is a circuit diagram showing a configuration example of a comparator shown in FIG. 4.

FIG. 6 is a circuit diagram showing a configuration example of the comparator 50 shown in FIG. 4.

In FIG. 6, a current I2 generated by a current source is supplied as the operating current of a P-type differential amplifier through two current-mirror circuits, and is supplied as a drain current I2' of a P-type output driver transistor. The voltage of the output node of the current-voltage converter 30 is supplied to the gate of one of a pair of P-type differential transistors of the P-type differential amplifier as an input signal IN. The reference voltage VR0 is supplied to the gate of the other P-type differential transistor of the P-type differential amplifier. The output voltage of the P-type differential amplifier is supplied as a gate voltage of an N-type output driver transistor.

The P-type output driver transistor and the N-type output driver transistor are connected in series between the power supply voltage VDD and the analog power supply voltage AGND, and the voltage of the connection node of the P-type output driver transistor and the N-type output driver transistor (drain of the P-type output driver transistor) is supplied to one end of the second switching element SW2 as the output voltage.

In the comparator 50 shown in FIG. 6, the high-potential-side current drive capability of the output voltage OUT is limited by the current I2'. The high-potential-side current drive capability is limited in FIG. 6 as compared with the configuration shown in FIGS. 5A and 5B in which the same signal is supplied to the gates of the P-type output transistor and the N-type output transistor forming the output buffer, for example.

Note that the configuration of the comparator 50 is not limited to the configuration shown in FIG. 6.

Figure 7:
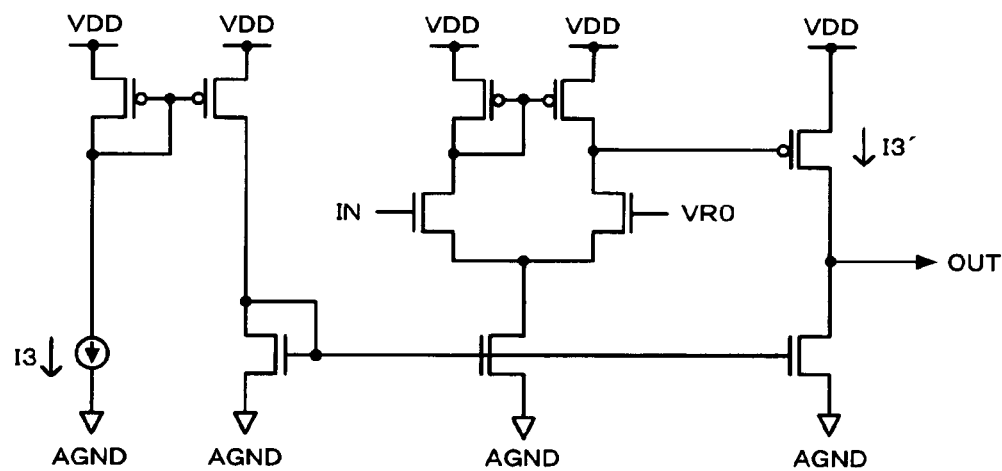
FIG. 7 is a circuit diagram showing another configuration example of the comparator shown in FIG. 4.

FIG. 7 is a circuit diagram showing another configuration example of the comparator 50 shown in FIG. 4.

In FIG. 7, a current I3 generated by a current source is supplied as the operating current of an N-type differential amplifier through two current-mirror circuits, and is supplied as a drain current I3' of an N-type output driver transistor. The voltage of the output node of the current-voltage converter 30 is supplied to the gate of one of a pair of N-type differential transistors of the N-type differential amplifier as the input signal IN. The reference voltage VR0 is supplied to the gate of the other N-type differential transistor of the N-type differential amplifier. The output voltage of the N-type differential amplifier is supplied as a gate voltage of a P-type output driver transistor.

The P-type output driver transistor and the N-type output driver transistor are connected in series between the power supply voltage VDD and the analog power supply voltage AGND, and the voltage of the connection node of the P-type output driver transistor and the N-type output driver transistor (drain of the N-type output driver transistor) is supplied to one end of the second switching element SW2 as the output voltage.

In the comparator 50 shown in FIG. 7, the high-potential-side current drive capability of the output voltage OUT is limited by the current I3'. The high-potential-side current drive capability is limited in FIG. 7 as compared with the configuration shown in FIGS. 5A and 5B in which the same signal is supplied to the gates of the P-type output transistor and the N-type output transistor forming the output buffer, for example.

In FIGS. 6 and 7, the current flowing through the current path connected to at least one of the high-potential-side power supply and the low-potential-side power supply is limited. Note that the current flowing through the current paths connected to the high-potential-side power supply and the low-potential-side power supply may be limited.

Figure 8:
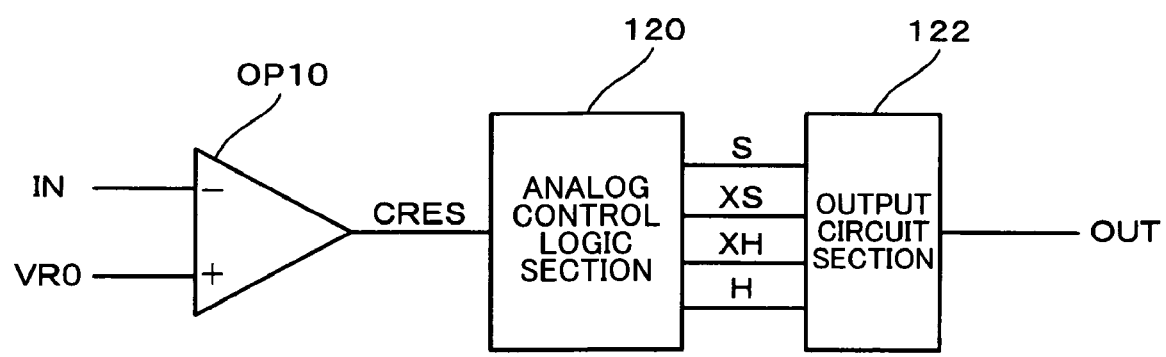
FIG. 8 is a circuit diagram showing yet another configuration example of the comparator shown in FIG. 4.

FIG. 8 is a circuit diagram showing yet another configuration example of the comparator 50 shown in FIG. 4.

In FIG. 8, the comparator 50 may include an operational amplifier OP10, an analog control logic section 120, and an output circuit section 122. The operational amplifier OP10 functions as a comparator. The operational amplifier OP10 compares the output signal from the current-voltage converter 30 as the input signal with the reference voltage VR0, and outputs a comparison result signal CRES. The analog control logic section 120 generates control signals S, XS, XH, and H which control the output circuit section 122 based on the comparison result signal CRES generated by the operational amplifier OP10. The output circuit section 122 generates the output signal while limiting the current supplied from the high-potential-side power supply or the current supplied to the low-potential-side power supply based on the control signals S, XS, XH, and H from the analog control logic section 120.

Figure 9A:
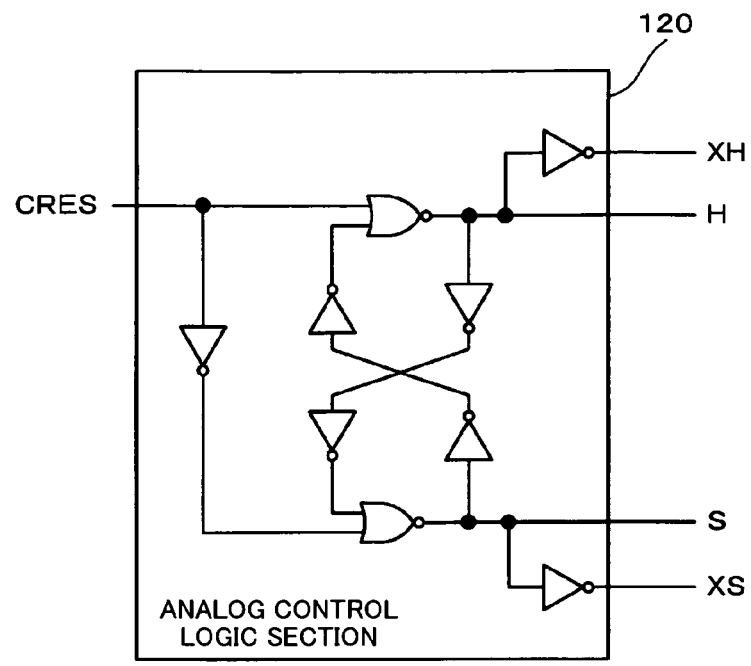
FIG. 9A is a circuit diagram showing a configuration example of an analog control logic section shown in FIG. 8.
Figure 9B:
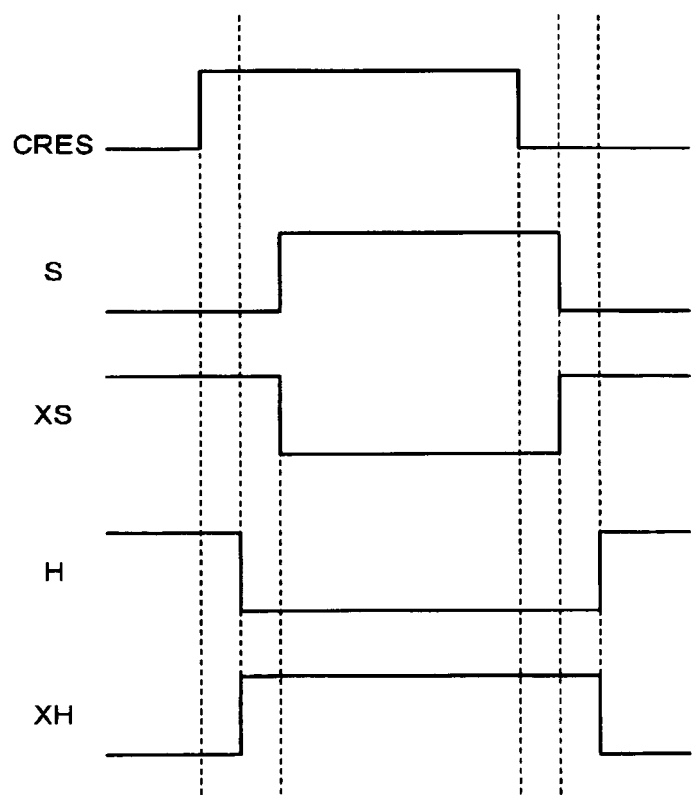
FIG. 9B is a timing diagram showing an operation example of an analog control logic section shown in FIG. 9A.

FIG. 9A is a circuit diagram showing a configuration example of the analog control logic section 120 shown in FIG. 8. FIG. 9B is a timing diagram showing an operation example of the analog control logic section 120 shown in FIG. 9A.

The analog control logic section 120 generates the control signals S and H based on the comparison result signal CRES so that the control signals S and H change at different timings. The control signal XS is an inversion signal of the control signal S. The control signal XH is an inversion signal of the control signal H. In FIG. 9A, the comparison result signal CRES and its inversion signal are respectively input to two-input, one-output NOR circuits. The other input signal of the first NOR circuit is a signal generated by delaying the signal output from the second NOR circuit, and the other input signal of the second NOR circuit is a signal generated by delaying the signal output from the first NOR circuit. According to this configuration, the control signal H rises based on the falling edge of the control signal S, and the control signal S rises based on the falling edge of the control signal H.

Therefore, the control signals S and H are generated so that the H-level periods do not overlap. Likewise, the control signals XS and XH are generated so that the L-level periods do not overlap.

Figure 10:
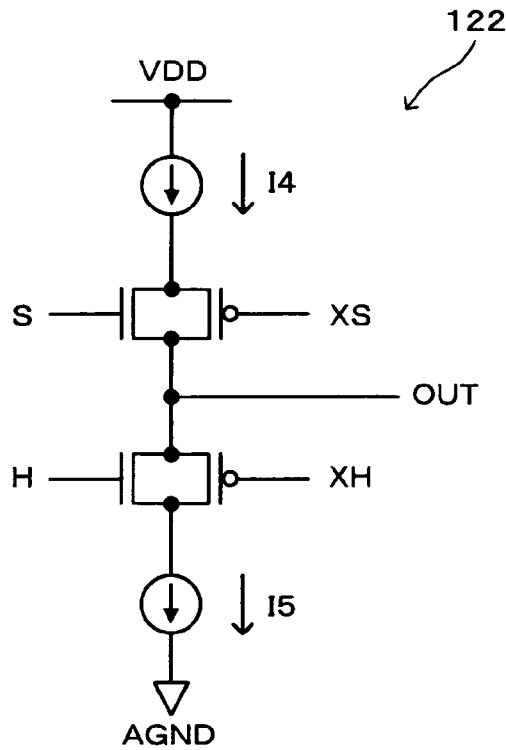
FIG. 10 is a view showing a configuration example of an output circuit section shown in FIG. 8.

FIG. 10 shows a configuration example of the output circuit section 122 shown in FIG. 8.

The output circuit section 122 includes first and second transfer gates, a first current source to which the power supply voltage VDD is supplied at one end and the first transfer gate is connected at the other end, and a second current source to which the second transfer gate is connected at one end and the analog power supply voltage AGND is supplied at the other end. The first current source generates a current I4. The second current source generates a current I5. The first and second transfer gates are connected in series, and the voltage of the connection node of the first and second transfer gates is output as the output voltage OUT of the comparator 50.

The control signals XS and S are respectively supplied to the gates of a P-type transistor and an N-type transistor forming the transfer gate connected with the first current source. The control signals XH and H are respectively supplied to the gates of a P-type transistor and an N-type transistor forming the transfer gate connected with the second current source.

According to this configuration, the first and second transfer gates are controlled so that these transfer gates are not turned ON at the same time. The second transfer gate is turned OFF when the first transfer gate is turned ON, whereby the output voltage OUT changes in a state in which the current is limited by the current I4 of the first current source. Likewise, the first transfer gate is turned OFF when the second transfer gate is turned ON, whereby the output voltage OUT changes in a state in which the current is limited by the current I5 of the second current source.

Figure 11:
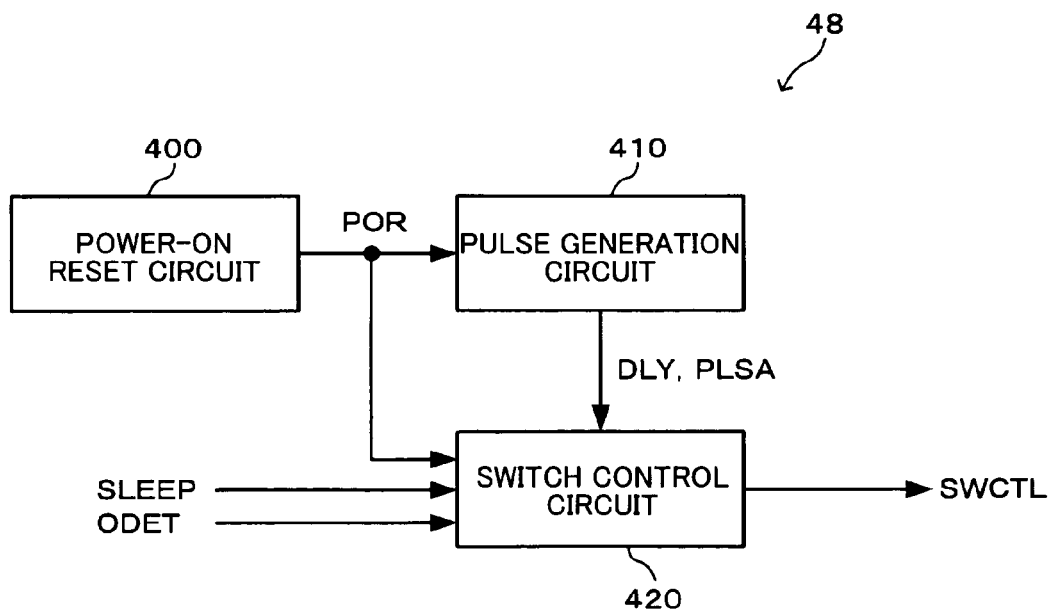
FIG. 11 is a block diagram showing a configuration example of an impulse generation control circuit shown in FIG. 1 or 4.

FIG. 11 is a block diagram showing a configuration example of the impulse generation control circuit 48 shown in FIG. 1 or 4.

The impulse generation control circuit 48 includes a power-on reset circuit 400, a pulse generation circuit 410, and a switch control circuit 420.

Figure 12:
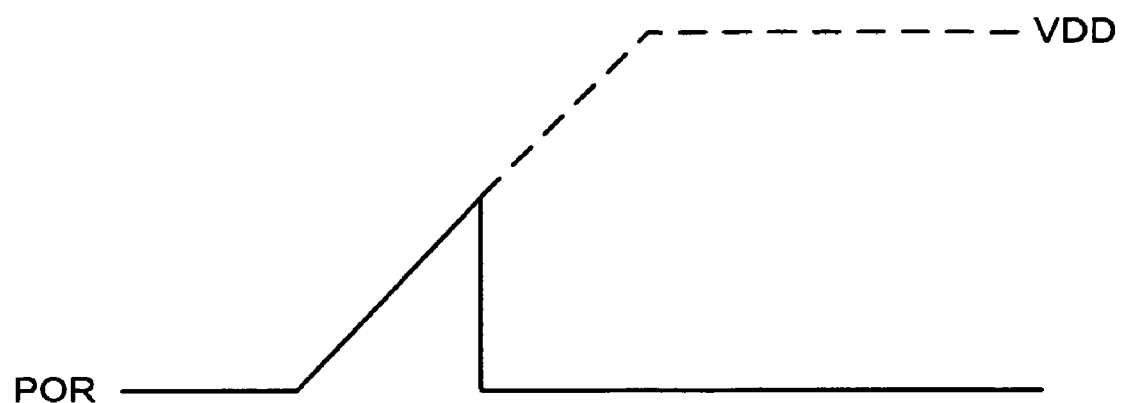
FIG. 12 is a view illustrative of a power-on reset circuit shown in FIG. 11.

The power-on reset circuit 400 generates a power-on reset signal POR shown in FIG. 12. Specifically, the power-on reset circuit 400 generates the power-on reset signal POR so that the power-on reset signal POR becomes active when the high-potential-side power supply voltage has reached a given threshold value level during a period from the time immediately after power is supplied to the time at which the high-potential-side power supply voltage reaches the voltage VDD. The power-on reset circuit 400 may be configured using a known circuit.

The pulse generation circuit 410 generates a pulse signal PLSA which contains one or more pulses in a specific period based on the power-on reset signal POR from the power-on reset circuit 400. The pulse generation circuit 410 outputs a delay signal DLY which is set at the H level in the above period.

Figure 13A:
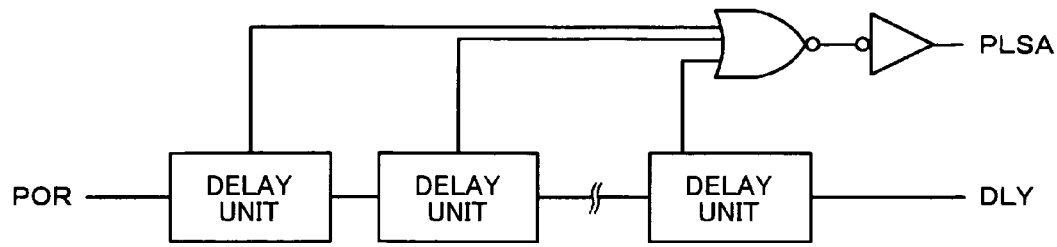
FIGS. 13A to 13D are views illustrative of a pulse generation circuit shown in FIG. 11.
Figure 13B:
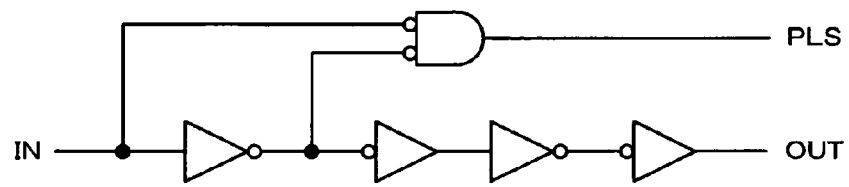
Figure 13C:
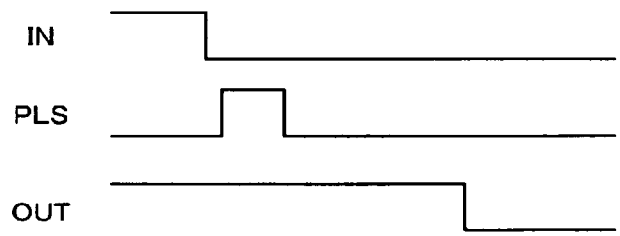
Figure 13D:
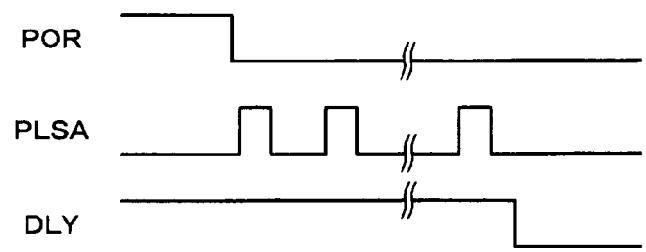

FIGS. 13A to 13D are views illustrative of the pulse generation circuit 410 shown in FIG. 11. FIG. 13A is a block diagram showing a configuration example of the pulse generation circuit 410 shown in FIG. 11. FIG. 13B is a circuit diagram and a timing diagram showing a configuration example of a delay unit shown in FIG. 13A. FIG. 13C shows a timing example of the delay unit shown in FIG. 13B. FIG. 13D is a timing diagram showing an operation example of the pulse generation circuit 410 shown in FIG. 13D.

As shown in FIG. 13A, the pulse generation circuit 410 includes a plurality of delay units. Each delay unit generates one pulse based on an input signal. The power-on reset signal POR is input to the delay unit in the first stage. The output from the delay unit in the final stage is output as the delay signal DLY. The pulses generated by the delay units are logical ORed and output as the pulse signal PLSA.

As shown in FIGS. 13B and 13C, the delay unit delays the input signal IN using inverters, and generates an output signal OUT which is input to the delay unit in the subsequent stage. The pulse signal PLS output from each delay unit is generated by the input and the output of a first-stage inverter circuit of the inverters, and is output as a falling-edge detection pulse of the input signal IN. The pulse signal PLSA is generated by logical ORing the pulse signals PLS from the delay units. The output signal OUT falls after a delay time due to the inverters based on the falling edge of the input signal IN.

The pulse signal PLSA having pulses in the number of delay units in a specific period which starts based on the falling edge of the power-on reset signal POR as shown in FIG. 13D is generated by logical ORing the pulse signals from the delay units shown in FIGS. 13B and 13C.

Again referring to FIG. 11, The sleep control signal SLEEP, the detection result signal ODET from the oscillation detector 44, the power-on reset signal POR from the power-on reset circuit 400, and the delay signal DLY and the pulse signal PLSA from the pulse generation circuit 410 are input to the switch control circuit 420 shown in FIG. 11. The switch control circuit 420 generates the switch control signal SWCTL having one or more pulses in a specific period based on the detection result signal ODET, the power-on reset signal POR, the delay signal DLY, and the pulse signal PLSA. The switch control circuit 420 can fix the logic level of the switch control signal SWCTL based on the sleep control signal SLEEP.

Figure 14A:
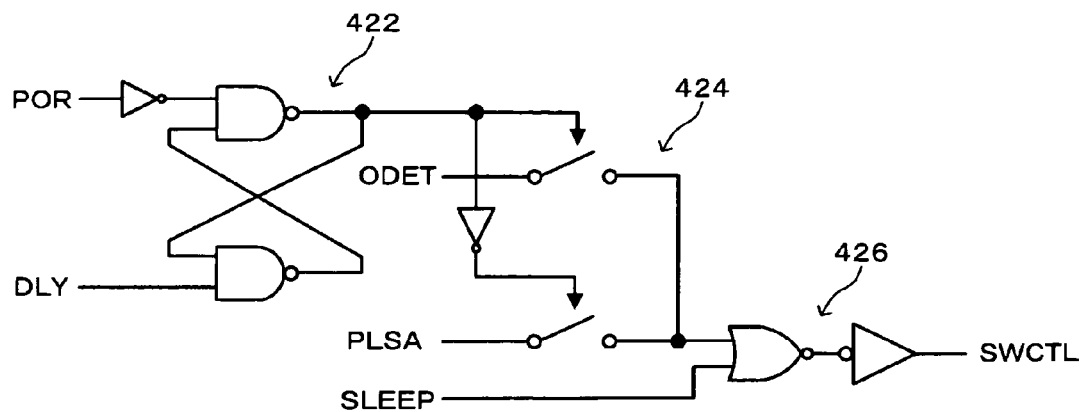
FIGS. 14A and 14B are views illustrative of a switch control circuit shown in FIG. 11.
Figure 14B:
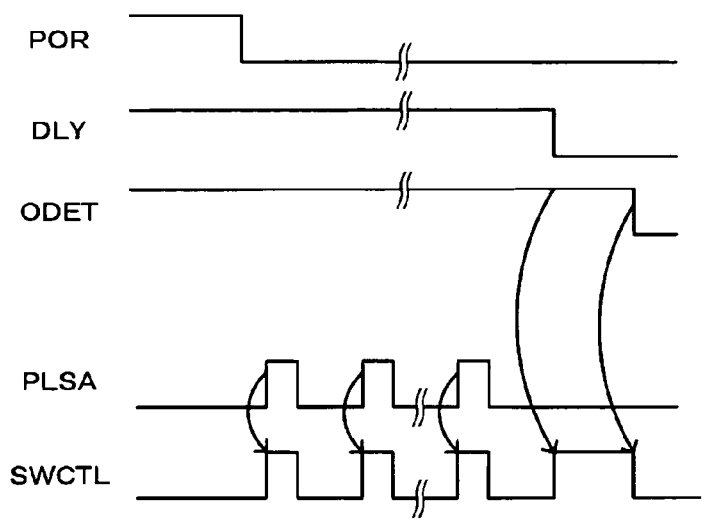

FIG. 14A is a circuit diagram of a configuration example of the switch control circuit 420 shown in FIG. 11. FIG. 14B is a timing diagram of an operation example of the switch control circuit 420 shown in FIG. 14A.

The switch control circuit 420 includes an RS flip-flop 422, a selector 424 which is controlled based on a signal output from the RS flip-flop 422, and a mask control circuit 426. The power-on reset signal POR is input to the switch control circuit 420 as a set input of the RS flip-flop 422, and the delay signal DLY is input to the switch control circuit 420 as a reset input of the RS flip-flop 422. The detection result signal ODET from the oscillation detector 44 and the pulse signal PLSA from the pulse generation circuit 410 are input to the selector 424. The detection result signal ODET or the pulse signal PLSA is selectively output based on the signal output from the RS flip-flop 422. The mask control circuit 426 outputs the switch control signal SWCTL obtained by masking the signal output from the selector 424 using the sleep control signal SLEEP. When the sleep control signal SLEEP is set at the H level, the mask control circuit 426 outputs the switch control signal SWCTL set at the H level. When the sleep control signal SLEEP is set at the L level, the mask control circuit 426 outputs the signal output from the selector 424 as the switch control signal SWCTL.

Therefore, the output signal of the RS flip-flop 422 is set when the power-on reset signal POR has fallen, whereby the selector 424 selectively outputs the pulse signal PLSA. When the sleep control signal SLEEP is set at the L level, the mask control circuit 426 outputs the pulse signal PLSA as the switch control signal SWCTL. The output signal of the RS flip-flop 422 is reset when the delay signal DLY has fallen, whereby the selector 424 selectively outputs the detection result signal ODET. When the sleep control signal SLEEP is set at the L level, the mask control circuit 426 outputs the detection result signal ODET as the switch control signal SWCTL.

According to the above configuration, the impulse generation control circuit 48 can output the switch control signal SWCTL (signal at a given frequency) having one or more pulses in a period from the falling edge (change timing) of the power-on reset signal POR to the falling edge (change timing) of the detection result signal ODET which indicates that the signal in the oscillation loop has exceeded a specific threshold value level.

The configuration of the oscillation driver circuit 10 is not limited to the configuration shown in FIG. 4.

In FIG. 1 or 4, the modulation circuit 90 switches between the output from the GCA 20 and the output from the comparator 50 in the oscillation startup state. Note that the modulation circuit may switch between and output the output from the GCA 20 or a given voltage. This also allows energy to be injected into the vibrator 12 during oscillation startup as the modulated signal from the modulation circuit, whereby the oscillation startup time of the vibrator 12 can be reduced. Moreover, since the frequency of the modulated signal from the modulation circuit is modulated to the resonance frequency of the vibrator 12, the oscillation condition does not differ to a large extent from the steady oscillation condition of the oscillation loop. Therefore, energy can be injected into the oscillation loop without hindering the oscillations of the vibrator, whereby oscillation startup can be efficiently achieved.

Moreover, the convenience to the user can be increased by specifying the start timing as described in this embodiment.

Furthermore, the length of the specific period can be specified by counting a given reference clock signal based on the start timing, for example. Specifically, the modulation finish timing can be easily determined. Therefore, the oscillation detector 44 which detects the oscillation amplitude can be omitted, for example, whereby the circuit scale can be reduced.

In FIGS. 11 to 14A and 14B, pulses equal to the number of delay units are generated. Note that the invention is not limited thereto. The number of pulses of the output from the oscillation circuit may be counted based on the change timing of the power-on reset signal POR, and the output from the oscillation circuit may be output as the switch control signal SWCTL in a period until a specific count value is reached. In this case, the finish timing of the specific period in which the impulse generation control circuit 48 outputs the pulsed switch control signal SWCTL is the timing at which a specific number of pulses has been counted based on the start timing of the specific period.

Figure 15:
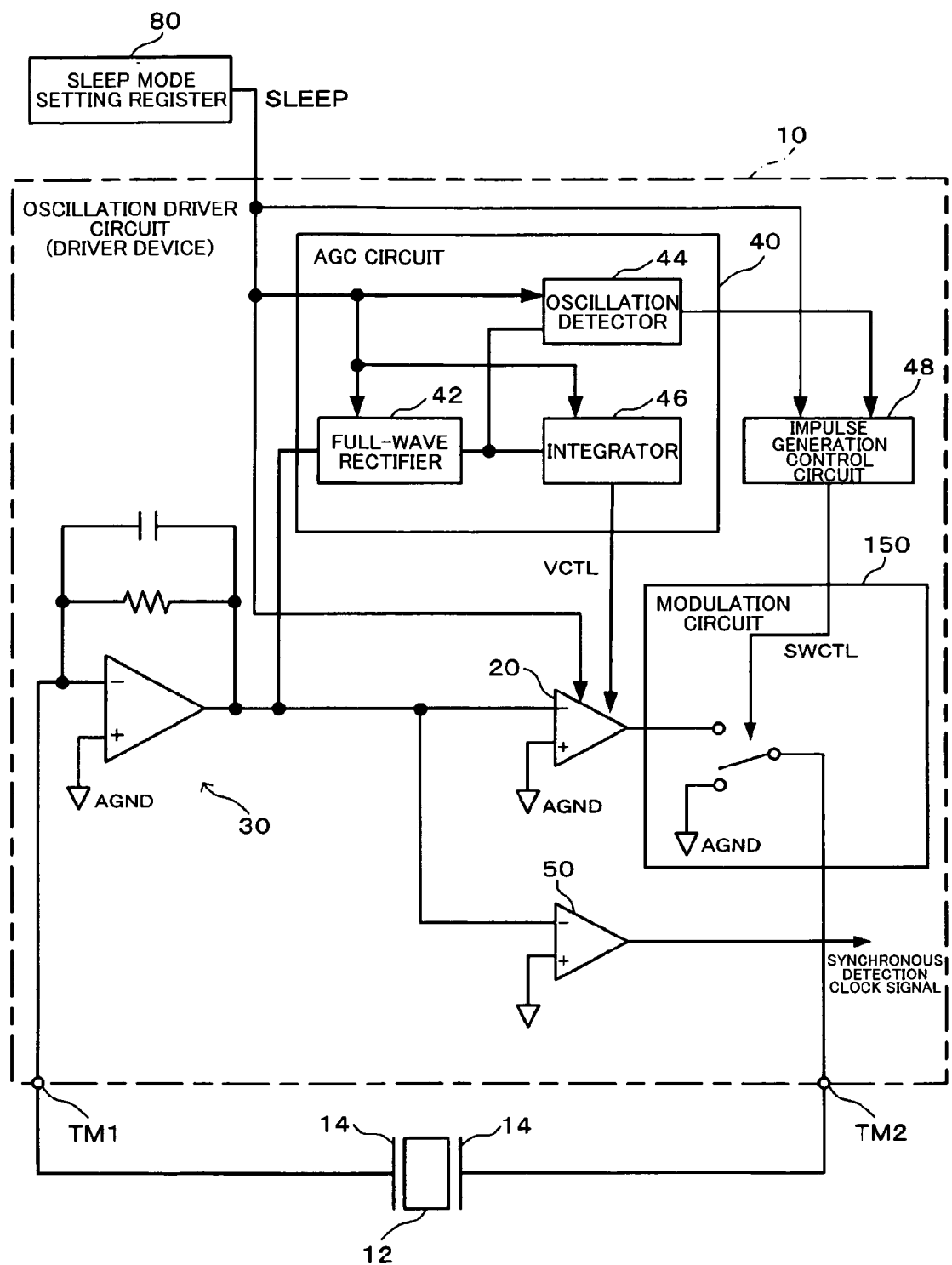
FIG. 15 is a view showing an oscillation driver circuit according to a modification of one embodiment of the invention.

FIG. 15 is a circuit diagram showing an oscillation driver circuit according to a modification of this embodiment.

In FIG. 15, the same sections as in FIG. 1 are indicated by the same symbols. Description of these sections is appropriately omitted. The oscillation driver circuit shown in FIG. 15 differs from the oscillation driver circuit 10 shown in FIG. 1 in that a modulation circuit 150 is provided instead of the modulation circuit 90 shown in FIG. 1.

The modulation circuit 150 includes a third switching element SW3. The third switching element SW3 supplies the signal output from the GCA 20 or a given voltage (voltage AGND in FIG. 15) to the vibrator 12 through the second connection terminal TM2. For example, the third switching element SW3 outputs the signal output from the GCA 20 to the vibrator 12 when the switch control signal SWCTL is set at the H level, and outputs the voltage AGND to the vibrator 12 when the switch control signal SWCTL is set at the L level.

According to this configuration, the output from the GCA 20 and the voltage AGND are alternately supplied to the vibrator 12 in the oscillation startup state.

1.5 Oscillation Conditions During Oscillation Startup and Stable Oscillations The oscillation driver circuit (driver device) 10 shown in FIG. 1 drives a physical quantity transducer 12 by means of an oscillation loop. In the oscillation driver circuit 10 according to this embodiment, the loop gain is set to be larger than unity during oscillation startup in order to enable high-speed startup. Specifically, the oscillation conditions during oscillation startup are satisfied when the loop gain is larger than unity and the phase in the loop is 360°×n (n is an integer). The oscillation conditions during stable oscillations are satisfied when the loop gain is unity and the phase in the loop is 360°×n (n is an integer).

1.6 Power Supply Voltage of Oscillation Driver Circuit

The oscillation driver circuit 10 shown in FIG. 1 operates between the voltage VDD (high-potential power supply voltage) and the voltage AGND (low-potential power supply voltage). The voltage AGND is a ground potential, for example. Note that another reference potential may be used instead of the ground potential. Specifically, the power supply potential which may be used differs depending on the type of vibrator 12.

When the vibrator 12 is a capacitive-coupling transducer (configuration in which a direct-current blocking capacitor lies in the signal path in the internal equivalent circuit), direct current is cut off. Therefore, with regard to the direct current level (bias point) of the oscillation loop, it suffices that the voltage amplitude of the drive signal of the oscillation loop be adjusted regardless of the circuit operation. Therefore, an arbitrary potential may be basically used as the low-potential-side power supply, for example.

When the vibrator 12 is a variable-resistance transducer, it is necessary to set the bias voltage of the oscillation loop at a desired level. Therefore, a reference voltage at a desired level is generally used.

The power supply method is classified into a single power supply method (method using only a positive power supply) and a dual power supply method (method using positive and negative power supplies). The latter method is used particularly when accuracy is important.

Note that the invention may employ either of the above power supply methods. In FIG. 1 (and other drawings), the vibrator 12 is a capacitive-coupling transducer as is clear from equivalent circuits shown in FIGS. 23A and 23B. The above description has been given on the assumption that a single power supply method is employed and the oscillation driver circuit 200 operates between the voltage VDD (e.g. 5 V) and the voltage GND (ground potential).

1.7 Rectangular-Wave Drive, Sine-Wave Drive, and Capacitive-Coupling Vibrator The driver device according to this embodiment shown in FIG. 1 may employ rectangular-wave drive and sine-wave drive.

Figure 23A:
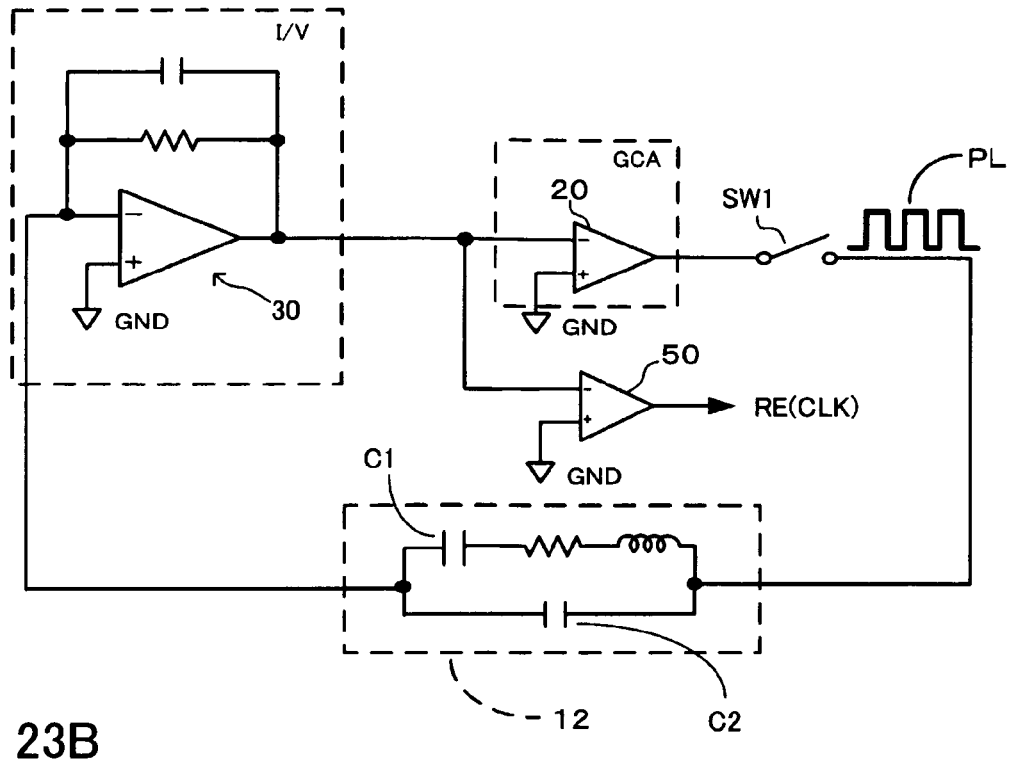
FIGS. 23A and 23B are circuit diagrams illustrative of rectangular-wave drive, sine-wave drive, and a capacitive-coupling vibrator.
Figure 23B:
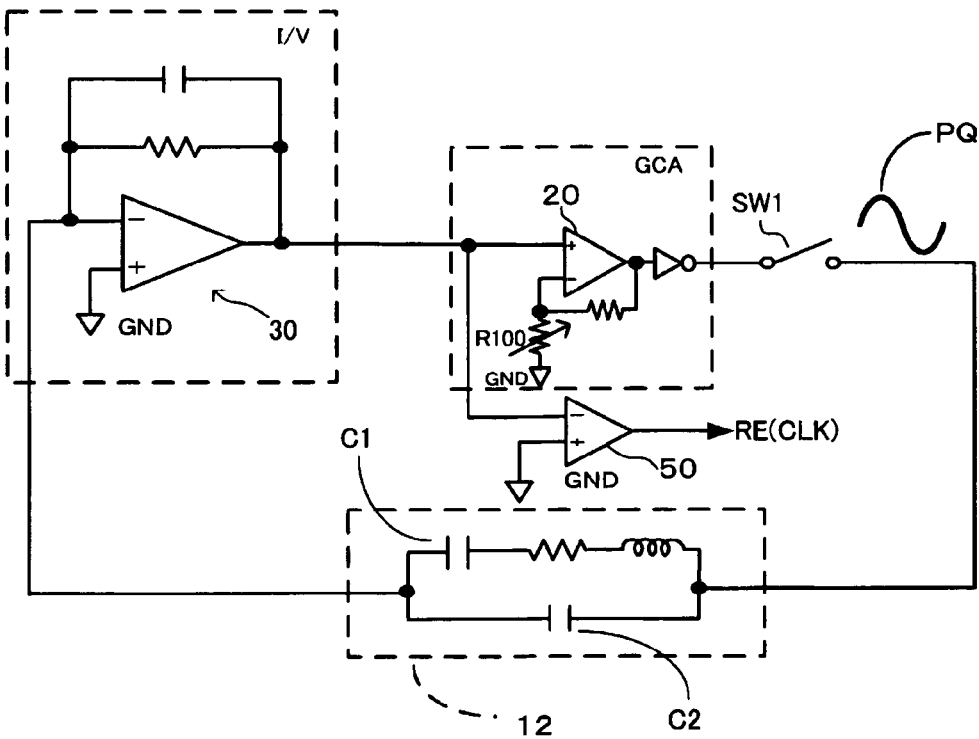

FIGS. 23A and 23B are circuit diagrams illustrative of rectangular-wave drive, sine-wave drive, and a capacitive-coupling vibrator. FIG. 23A shows the main portion of the driver device which performs rectangular-wave drive. As shown in FIG. 23A, the vibrator 12 is driven by a rectangular-wave drive signal (PL). The gain of the oscillation loop can be easily controlled by adjusting the high-level voltage or the low-level voltage of the drive signal (PL).

The rectangular-wave drive method has an advantage in that the variation in the drive signal (PL) is small. Moreover, since the voltage amplitude of the drive signal is easily controlled, the circuit configuration can be simplified, whereby the circuit scale can be reduced.

FIG. 23B shows the main portion of the driver device which performs sine-wave drive. As shown in FIG. 23B, the vibrator 12 is driven by a sine-wave drive signal (PQ). The gain control amplifier (GCA) 20 controls the gain in the oscillation loop by variably controlling the resistance of a variable resistor 100.

In FIGS. 23A and 23B, a capacitive-coupling vibrator is used as the vibrator 14. Note that the vibrator 14 is not limited thereto. Various vibrators such as a variable-resistance vibrator may also be used.

The capacitive-coupling vibrator (capacitive vibrator) is a vibrator in which a direct-current blocking capacitor (C1 and C2 in FIG. 23) lies in the signal path in the internal equivalent circuit. A piezoelectric element can be given as an example of the capacitive-coupling vibrator (capacitive vibrator).

When using a capacitive-coupling vibrator, an arbitrary potential may be used as the direct-current potential of the oscillation loop. Therefore, the degree of freedom relating to the circuit configuration is increased.

Type of Vibrator

In this embodiment, a capacitive-coupling vibrator is used as the vibrator 12, as described above. Note that the vibrator 12 is not limited thereto. Various vibrators such as a variable-resistance vibrator may also be used.

The capacitive-coupling vibrator (capacitive vibrator) is a vibrator in which a direct-current blocking capacitor lies in the signal path in the internal equivalent circuit, as shown in FIGS. 23A and 23B. A piezoelectric element can be given as an example of the capacitive-coupling vibrator (capacitive vibrator).

When using a capacitive-coupling vibrator, an arbitrary potential may be used as the direct-current potential of the oscillation loop. Therefore, a circuit can be formed without taking the direct-current potential into account, whereby the degree of freedom of the circuit configuration is increased.

Second Embodiment

2. Configuration and Operation of Vibrating Gyrosensor

Figure 16:
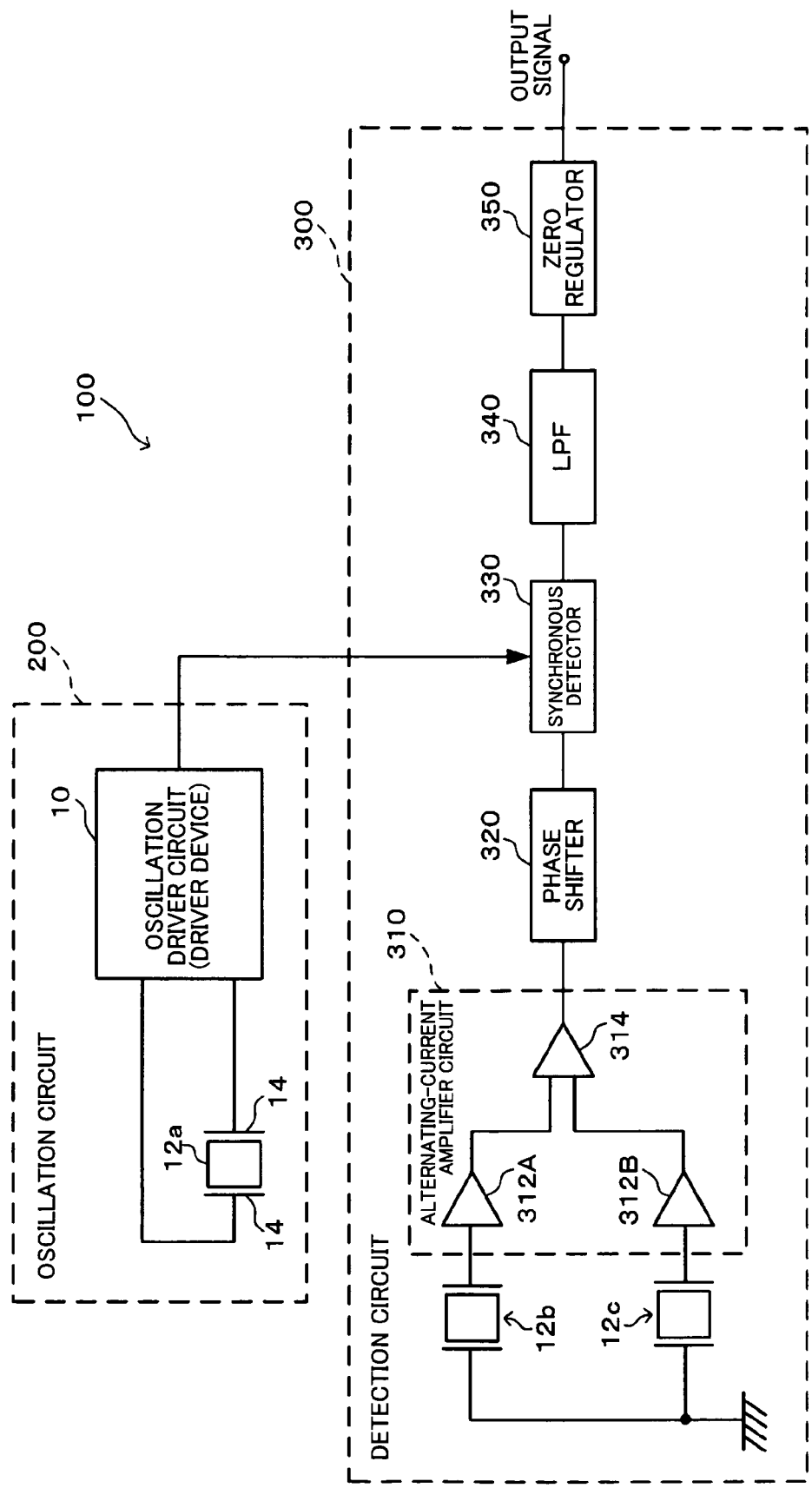
FIG. 16 is a block diagram showing a configuration example of a vibrating gyrosensor according to one embodiment of the invention.

FIG. 16 is a block diagram showing a configuration example of a vibrating gyrosensor to which the oscillation driver circuit according to this embodiment or its modification is applied.

In FIG. 16, the same sections as in FIG. 1 are indicated by the same symbols. Description of these sections is appropriately omitted.

A vibrating gyrosensor (physical quantity measuring device in a broad sense) 100 includes an oscillation circuit 200 and a detection circuit (detection device in a broad sense) 300. The oscillation circuit 200 includes the vibrator 12 and the oscillation driver circuit 10. The oscillation driver circuit 10 causes a driving vibration section 12a of the vibrator 12 to oscillate.

During oscillation startup in the normal mode, the output from the comparator 50 is input to the oscillation driver circuit 10 as noise. The noise is subjected to frequency selection while passing through the driving vibration section 12a of the vibrator 12. The signal which has passed through the driving vibration section 12a is partially removed, is input to the full-wave rectifier 42, and is converted into an amplitude. The signal with this amplitude is input to the oscillation detector 44. The impulse generation control circuit 48 which has received the detection result signal ODET from the oscillation detector 44 generates the switch control signal SWCTL. The amplitude of the signal subjected to frequency selection while passing through the vibrator 12a is small during oscillation startup. The impulse generation control circuit 48 outputs the switch control signal SWCTL shown in FIG. 2A.

The amplitude of the signal subjected to frequency selection while passing through the vibrator 12a increases immediately after oscillation startup in the normal mode, whereby the switch control signal SWCTL generated by the impulse generation control circuit 48 is set at the H level. This causes the oscillation loop to be switched so that the amplitude of the signal subjected to frequency selection while passing through the vibrator 12a is controlled by the GCA 20. When most of the noise is cut off by the driving vibration section 12a and the output from the full-wave rectifier 42 is relatively small, the gain of the GCA 20 is increased so that the loop gain of the oscillation loop becomes unity. Since the output from the full-wave rectifier 42 increases with the passage of time, the gain of the GCA 20 is reduced so that the loop gain becomes unity.

The vibrating gyrosensor is controlled in the sleep mode in the same manner as in the oscillation startup state in the normal mode.

When the oscillation state of the driving signal has been stabilized, detection of signals from driving detection sections 12b and 12c of the vibrator 12 starts. Specifically, the detection signals (alternating-current) from the driving detection sections 12b and 12c of the vibrator are amplified using alternating-current amplifiers 312A and 312B of an alternating-current amplifier circuit 310, and the outputs from the amplifiers 312A and 312B are summed using an adder 314.

The output from the adder 314 is caused to pass through a phase shifter 320 to obtain a phase-shifted signal. The phase of the phase-shifted signal differs from the phase of the synchronous detection clock signal which is the output from the comparator 50 of the oscillation driver circuit 10 by a specific angle (e.g., 90°). The phase-shifted signal and the synchronous detection clock signal from the oscillation driver circuit 10 are input to a synchronous detector 330 to detect the output signal from the vibrator 12. As a result, unnecessary leakage signals are removed from the detected output signal or at least reduced. Since the phase can be adjusted according to a change in phase during the weak signal detection process by adjusting the phases of the synchronous detection clock signal and the detection signal using the detection circuit 300, a highly accurate phase adjustment can be achieved while preventing an increase in circuit scale.

The detected output signal is input to a low-pass filter 340, smoothed, and input to a zero regulator 350. The output from the zero regulator 350 is removed as an output signal corresponding to the physical quantity (e.g. angular velocity) to be measured.

The vibrating gyrosensor 100 shown in FIG. 16 is preferably provided in electronic instruments such as a video camera, a digital camera, a car navigation system, an aircraft, and a robot.

The invention is not limited to the vibrator 12 described in this embodiment. As examples of the material for the vibrator 12, constant modulus alloys such as elinvar and ferroelectric single crystals (piezoelectric single crystals) can be given. As examples of such single crystals, a rock crystal, lithium niobate, lithium tantalate, a lithium niobate-lithium tantalate solid solution, lithium borate, and langasite can be given. It is preferable that the vibrator 12 be hermetically sealed in a package. It is preferable that the package be filled with dry nitrogen or be under vacuum.

The physical quantity measured according to the invention is not limited to the angular velocity illustrated in this embodiment. The invention aims at a physical quantity which can be detected from a change in vibration state using a detection circuit when the vibrator is caused to produce driving vibrations and the vibration state of the vibrator has changed due to the effects of the physical quantity on the vibrator which is producing driving vibrations. As such a physical quantity, acceleration, angular acceleration, and the like are particularly preferred in addition to the angular velocity applied to the vibrator. As the detection device, an inertial sensor or the like is preferred.

Although only some embodiments of the invention have been described above in detail, those skilled in the art would readily appreciate that many modifications are possible in the embodiments without materially departing from the novel teachings and advantages of the invention. Accordingly, such modifications are intended to be included within the scope of the invention.

What is claimed is:

1. A driver device that forms an oscillation loop with a vibrator and causes the vibrator to produce driving vibrations, the driver device comprising:

a gain control amplifier that causes the vibrator to produce the driving vibrations by controlling an oscillation amplitude in the oscillation loop;

a signal generation circuit that generates a signal having a given frequency in the oscillation startup state, and stops the signal generation in the steady oscillation state; and a modulation circuit that modulates the frequency of the signal generated by the signal generation circuit to a resonance frequency of the vibrator, the modulation circuit including a switch provided in the oscillation loop, the itch being turned ON/OFF based on the signal venerated by the signal generation circuit, a mixed signal having the same frequency as the ON/OFF frequency of the switch is generated in the oscillation loop, a signal component that is contained in the mixed signal and has a frequency that coincides with the resonance frequency of the vibrator is output from the vibrator, and the gain control amplifier amplifies the signal component output from the vibrator, the modulation circuit modulates the mixed signal using an output signal from the gain control amplifier, the driver device causing the vibrator to produce the driving vibrations using the signal modulated by the modulation circuit in the oscillation startup state, and then causing the vibrator to produce the driving vibrations by controlling the oscillation amplitude in the oscillation loop formed by the vibrator, the gain control amplifier and the switch being turned on in the steady oscillation state.

2. The driver device as defined in claim 1, the modulation circuit including a comparator that generates a synchronous detection reference signal based on a signal in the oscillation loop; and the driver device causing the vibrator to produce the driving vibrations based on the signal modulated by the modulation circuit while switching between an output from the gain control amplifier and an output from the comparator, and then causing the vibrator to produce the driving vibrations by controlling the oscillation amplitude in the oscillation loop formed by the vibrator and the gain control amplifier.

3. The driver device as defined in claim 2, when the driver device is set in a first operation mode to perform a normal operation, the driver device causing the vibrator to produce the driving vibrations using the signal modulated by the modulation circuit, and then causing the vibrator to produce the driving vibrations by controlling the oscillation amplitude in the oscillation loop formed by the vibrator and the gain control amplifier; and when the driver device is set in a second operation mode to perform a sleep operation, the driver device causing the vibrator to produce the driving vibrations in the oscillation loop formed by the vibrator and the comparator.

4. The driver device as defined in claim 3, the driver device further including:

a gain control circuit that controls a gain of the gain control amplifier based on an oscillation signal in the oscillation loop, when the driver device is set in the second operation mode, the driver device disabling operations of the gain control amplifier and the gain control circuit without disabling an operation of the comparator.

5. The driver device as defined in claim 3, the signal generation circuit generating the signal having the given frequency only in a specific period that starts based on a switch timing from the second operation mode to the first operation mode.

6. The driver device as defined in claim 2, the polarity of the output from the gain control amplifier with respect to a reference potential being the same as the polarity of the output from the comparator with respect to the reference potential.

7. The driver device as defined in claim 1, the driver device causing the vibrator to produce the driving vibrations based on the signal modulated by the modulation circuit while switching between an output from the gain control amplifier and a given voltage, and then causing the vibrator to produce the driving vibrations by controlling the oscillation amplitude in the oscillation loop formed by the vibrator and the gain control amplifier.

8. The driver device as defined in claim 1, the signal generation circuit generating the signal having the given frequency only in a specific period during the oscillation startup state.

9. The driver device as defined in claim 8, a start timing of the specific period being a power-on reset start timing of the driver device.

10. The driver device as defined in claim 8, a finish timing of the specific period being a timing when it has been detected that a signal in the oscillation loop has exceeded a specific threshold value level or a timing when a specific number has been counted based on a start timing of the specific period.

11. The driver device as defined in claim 1, the modulation circuit being provided in the oscillation loop on an output side of the gain control amplifier and electrically connected with one end of the vibrator.

12. The driver device as defined in claim 1,
the signal generation circuit including:
a power-on reset circuit that generates a power-on reset signal; and
a pulse generation circuit that generates one or more pulses in a specific period based on the power-on reset signal;
the pulse generation circuit including a plurality of delay units, each of the plurality of delay units generating a pulse based on an input signal, the pulse generation circuit outputting a logical OR result of the pulses generated by the plurality of delay units; and
the driver device outputting the signal having the given frequency in a period from a change timing of the power-on reset signal to a change timing of a detection result signal that indicates that the signal in the oscillation loop has exceeded a specific threshold value level.

13. A physical quantity measuring device that measures a physical quantity corresponding to a detection signal output from a vibrator based on driving vibrations produced by the vibrator and the physical quantity to be measured, the physical quantity measuring device comprising:
the vibrator;
the driver device as defined in claim 1 that causes the vibrator to produce the driving vibrations; and
a detection device that detects an output signal corresponding to the physical quantity based on the detection signal,
the detection device including a synchronous detector that synchronously detects the detection signal based on an output from a comparator, the comparator generating a synchronous detection reference signal based on a signal in the oscillation loop.

14. The physical quantity measuring device as defined in claim 13, the detection device including a phase shifter that adjusts phases of the output from the comparator and the detection signal.

15. An electronic instrument including the physical quantity measuring device as defined in claim 13.

16. The driver device as defined in claim 1,
the vibrator being a capacitive-coupling vibrator; and
the gain control amplifier causing the vibrator to produce the driving vibrations by applying a rectangular-wave drive signal to the vibrator.

17. The driver device as defined in claim 1,
the signal generation circuit generating the signal that has a first frequency higher than the resonance frequency of the vibrator; and
the modulation circuit AM-modulating the mixed signal that is mixed into the oscillation loop based on the signal that has the first frequency using an output signal from the gain control amplifier, the mixed signal having the first frequency and functioning as a carrier, and the output signal from the gain control amplifier functioning as a modulation signal and having a second frequency that is the same as the resonance frequency of the vibrator.

18. The driver device as defined in claim 17,
the mixed signal containing a signal component having the second frequency;
the signal component having the second frequency contained in the mixed signal being selected as a result of frequency selection by the vibrator;
the gain control amplifier outputting the output signal based on the selected signal component having the second frequency;
the modulation circuit AM-modulating the mixed signal using the output signal from the gain control amplifier as the modulation signal; and
the AM-modulated signal output from the modulation circuit being supplied to the vibrator so that oscillations at the second frequency grow in the oscillation loop.

19. The driver device as defined in claim 1,
the modulation circuit including at least one switch provided in the oscillation loop; and
the signal generation circuit generating a switch control signal having a frequency higher than the resonance frequency of the vibrator, the at least one switch being turned ON/OFF based on the switch control signal.

20. The driver device as defined in claim 19,
a rectangular-wave signal that has a state similar to an impulse and contains white noise being mixed into the oscillation loop by turning the at least one switch ON/OFF based on the switch control signal; and
a signal component having a frequency that coincides with the resonance frequency of the vibrator being selected from the white noise contained in the rectangular-wave signal as a result of frequency selection by the vibrator, and oscillations at the resonance frequency of the vibrator growing in the oscillation loop due to the selected signal component that serves as a cause of oscillations.

21. The driver device as defined in claim 20,
an output signal being output from the gain control amplifier based on the signal component that has been selected by the vibrator and has a frequency that coincides with the resonance frequency of the vibrator;
the modulation circuit AM-modulating the rectangular-wave signal mixed into the oscillation loop using the output signal from the gain control amplifier as a modulation signal, the rectangular-wave signal having a state similar to an impulse and containing the white noise; and
the AM-modulated signal output from the modulation circuit being supplied to the vibrator.

* * * * *